(12) United States Patent
Kim et al.

(10) Patent No.: US 11,404,618 B2
(45) Date of Patent: Aug. 2, 2022

(54) LIGHT-EMITTING DEVICE PACKAGE AND LIGHT SOURCE MODULE

(71) Applicant: SUZHOU LEKIN SEMICONDUCTOR CO., LTD., Taicang (CN)

(72) Inventors: Ki Seok Kim, Seoul (KR); Chang Man Lim, Seoul (KR); Won Jung Kim, Seoul (KR)

(73) Assignee: SUZHOU LEKIN SEMICONDUCTOR CO., LTD., Tiacang (CN)

(*) Notice: Subject to any disclaimer, the term of this patent is extended or adjusted under 35 U.S.C. 154(b) by 69 days.

(21) Appl. No.: 17/059,132

(22) PCT Filed: May 29, 2019

(86) PCT No.: PCT/KR2019/006417
§ 371 (c)(1),
(2) Date: Nov. 25, 2020

(87) PCT Pub. No.: WO2019/231227
PCT Pub. Date: Dec. 5, 2019

(65) Prior Publication Data
US 2021/0210665 A1    Jul. 8, 2021

(30) Foreign Application Priority Data

May 30, 2018    (KR) .................. 10-2018-0061494

(51) Int. Cl.
*H01L 33/62*    (2010.01)
*H01L 33/48*    (2010.01)
(Continued)

(52) U.S. Cl.
CPC ............ *H01L 33/62* (2013.01); *H01L 33/486* (2013.01)

(58) Field of Classification Search
CPC ....... H01L 33/62; H01L 33/486; H01L 33/60; H01L 33/483; H01L 33/20; H01L 33/38; H01L 25/075
See application file for complete search history.

(56) References Cited

U.S. PATENT DOCUMENTS

| 2002/0175621 A1 | 11/2002 | Song et al. |
| 2014/0232293 A1* | 8/2014 | Kam ................. H01L 33/08 315/294 |
| 2017/0358716 A1 | 12/2017 | Park et al. |

FOREIGN PATENT DOCUMENTS

| KR | 10-2002-0089785 A | 11/2002 |
| KR | 10-2012-0084553 A | 7/2012 |

(Continued)

*Primary Examiner* — Marcos D. Pizarro
*Assistant Examiner* — Antonio B Crite
(74) *Attorney, Agent, or Firm* — Birch, Stewart, Kolasch & Birch, LLP

(57) ABSTRACT

A light-emitting device package according to one embodiment comprises: a body including a through-hole formed in an upper surface and a lower surface; a light-emitting device arranged on the upper surface of the body and including first and second bonding units spaced apart from each other; and first and second metal units arranged so as to be spaced apart from each other on the rear surface of the body, wherein a partial area of each of the first and second bonding units overlaps with the through-hole in a vertical direction, the first and second metal units respectively includes first and second extension portions extending to the through-hole; the first and second extension portions is electrically connected to the first and second bonding units, respectively; and the first and second extension portions face each other within the through-hole.

20 Claims, 18 Drawing Sheets

(51) Int. Cl.
*H01L 25/075* (2006.01)
*H01L 33/50* (2010.01)
*H01L 33/60* (2010.01)
*H01L 33/40* (2010.01)
*H01L 33/20* (2010.01)
*H01L 33/38* (2010.01)

(56) References Cited

FOREIGN PATENT DOCUMENTS

| | | |
|---|---|---|
| KR | 10-2014-0008911 A | 1/2014 |
| KR | 10-2014-0103513 A | 8/2014 |
| KR | 10-2015-0017920 A | 2/2015 |
| KR | 10-2015-0078670 A | 7/2015 |
| KR | 10-2017-0141306 A | 12/2017 |

* cited by examiner

[Fig. 1]
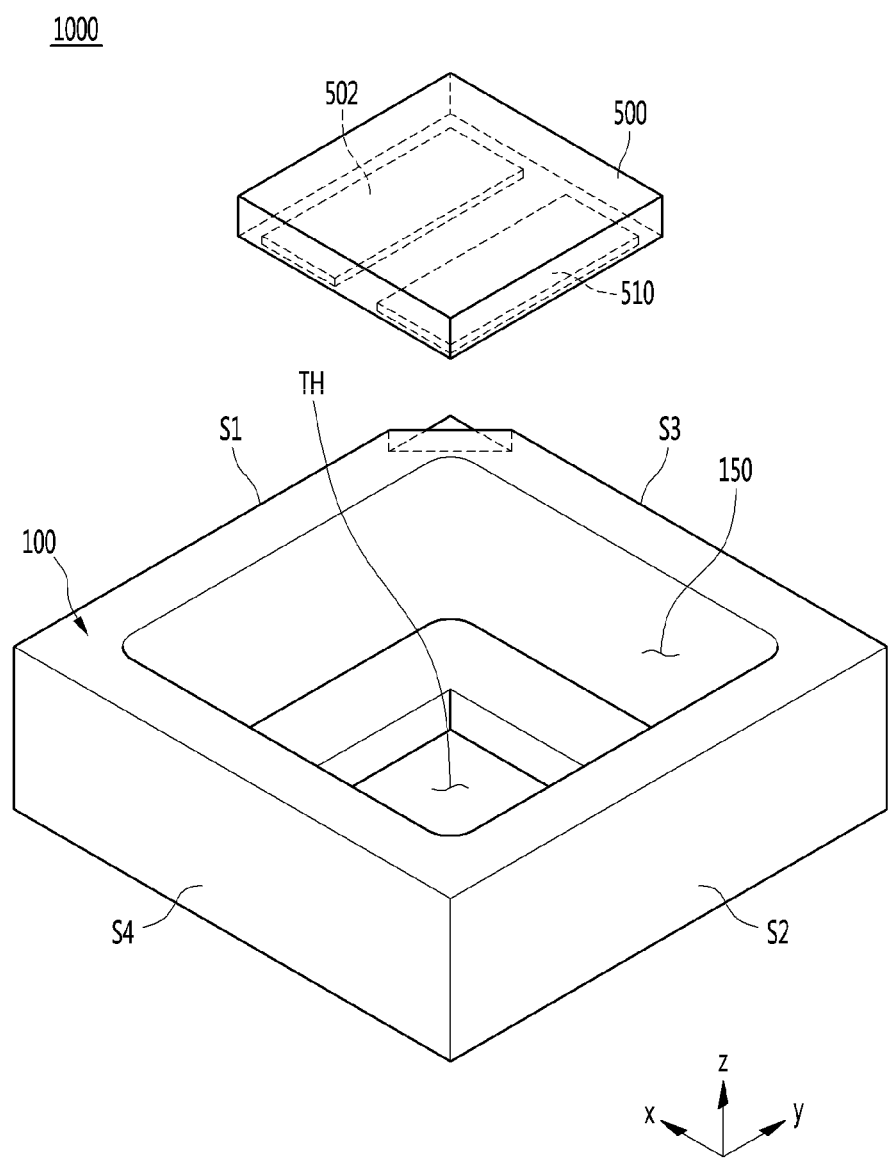

[Fig. 2]
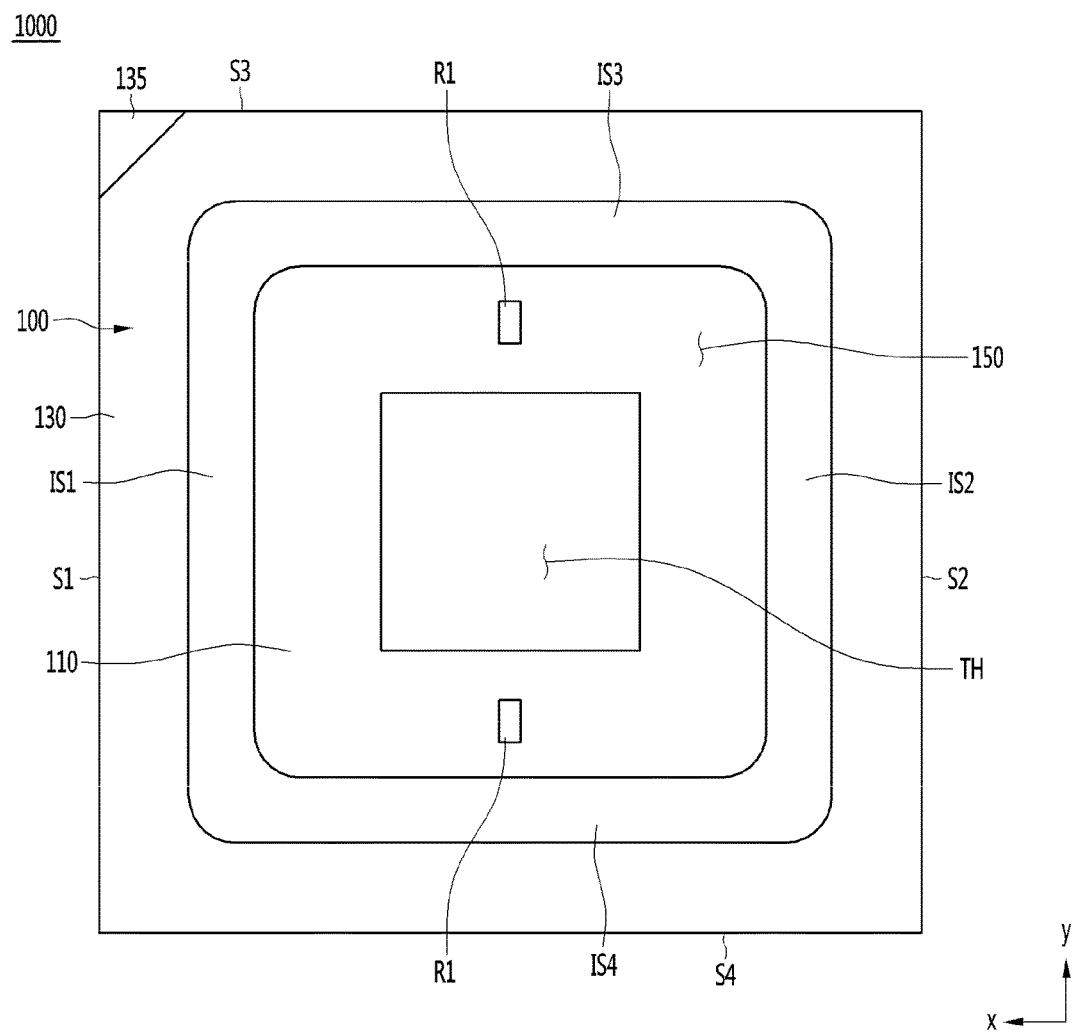

[Fig. 3]
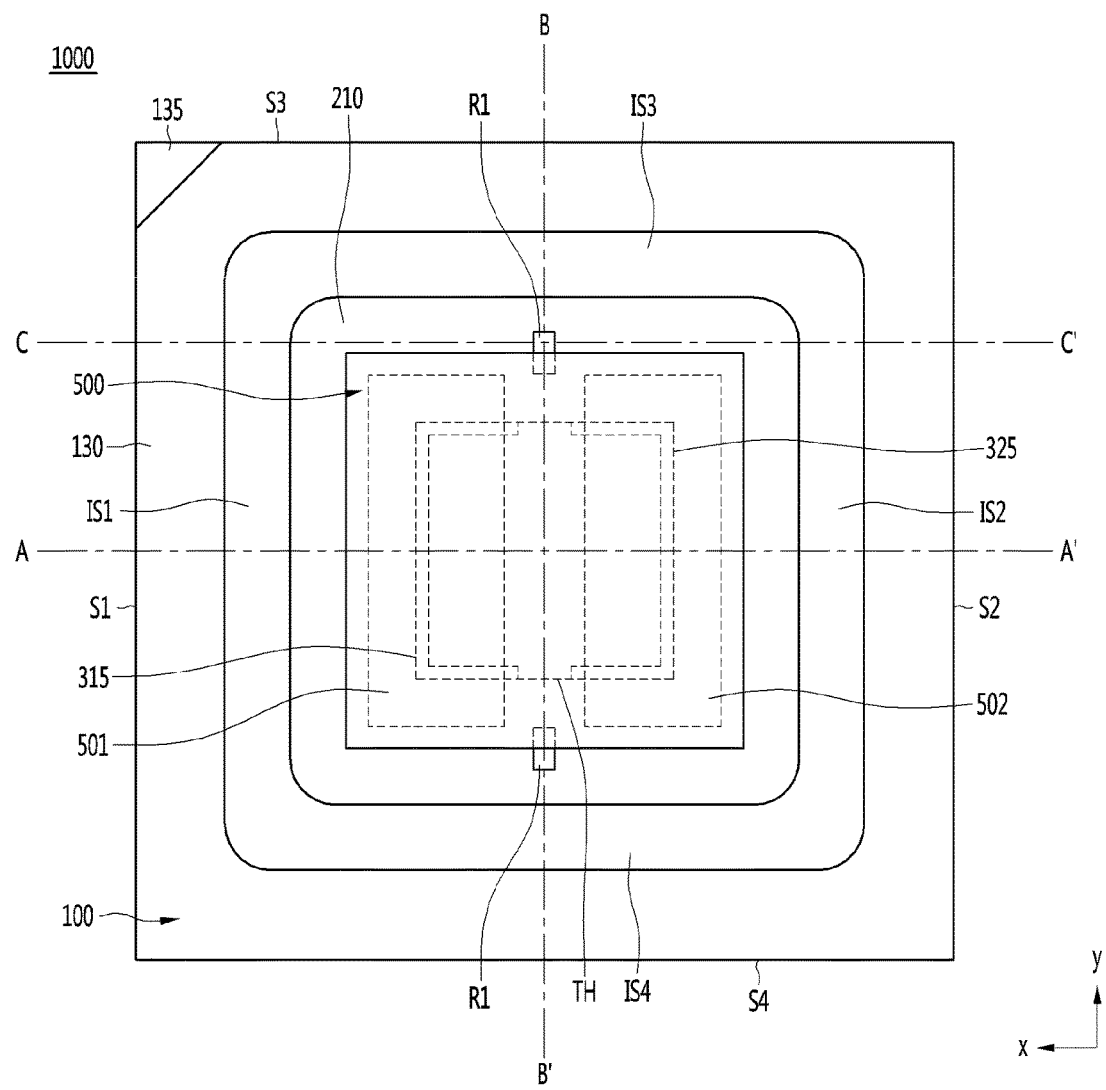

[Fig. 4]
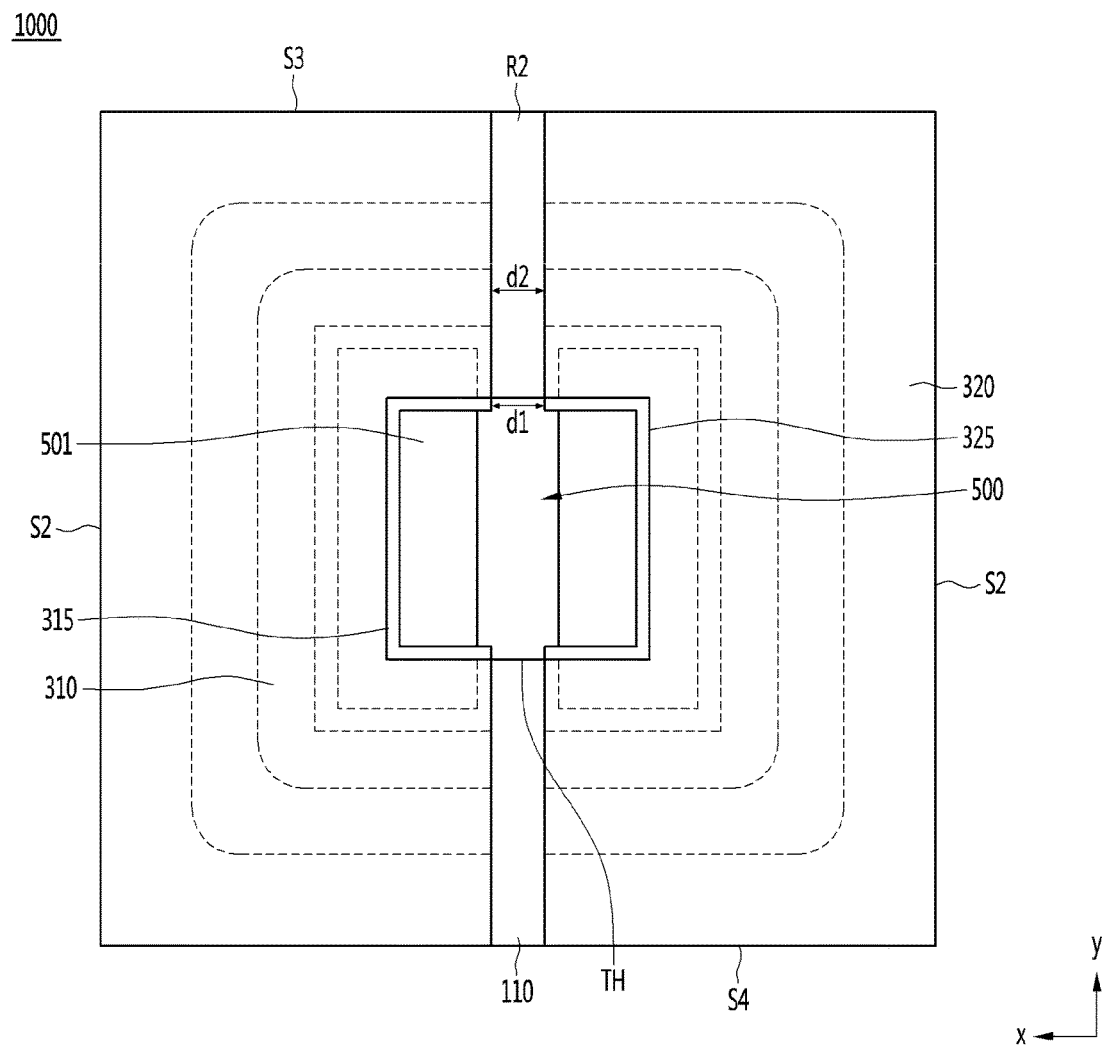

[Fig.5]
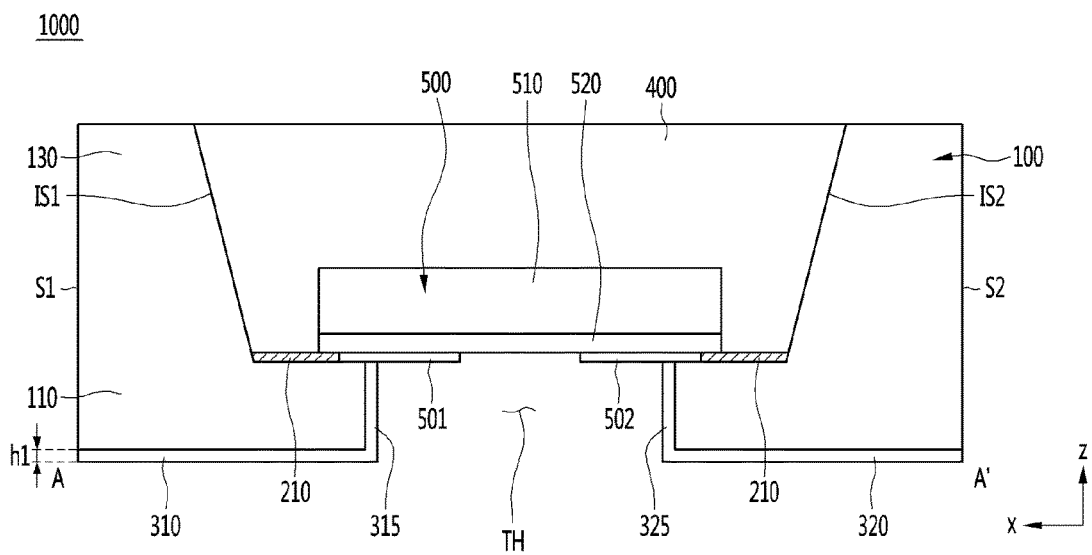
[Fig. 6]
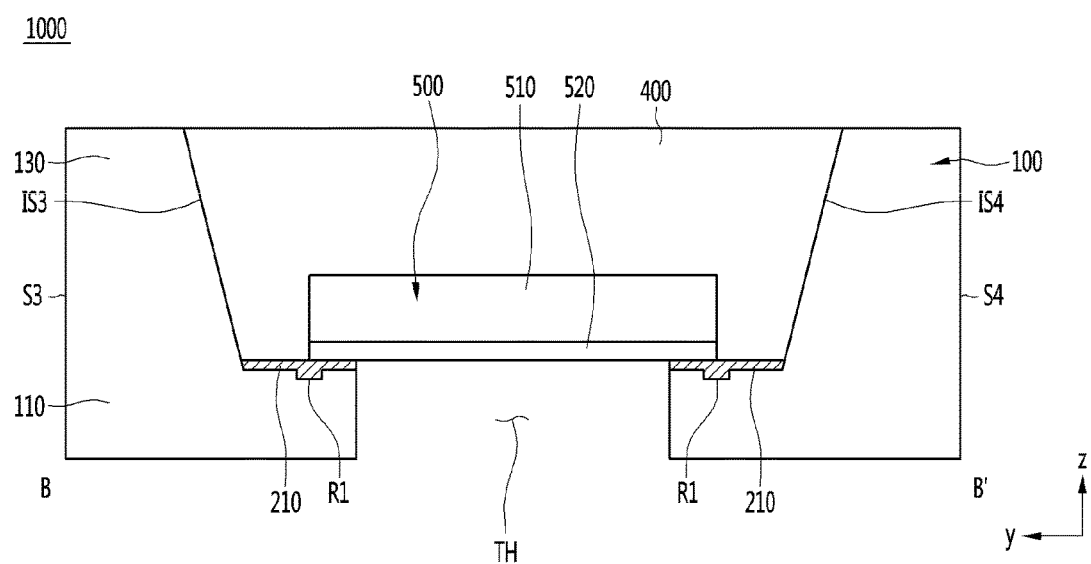

[Fig. 7]
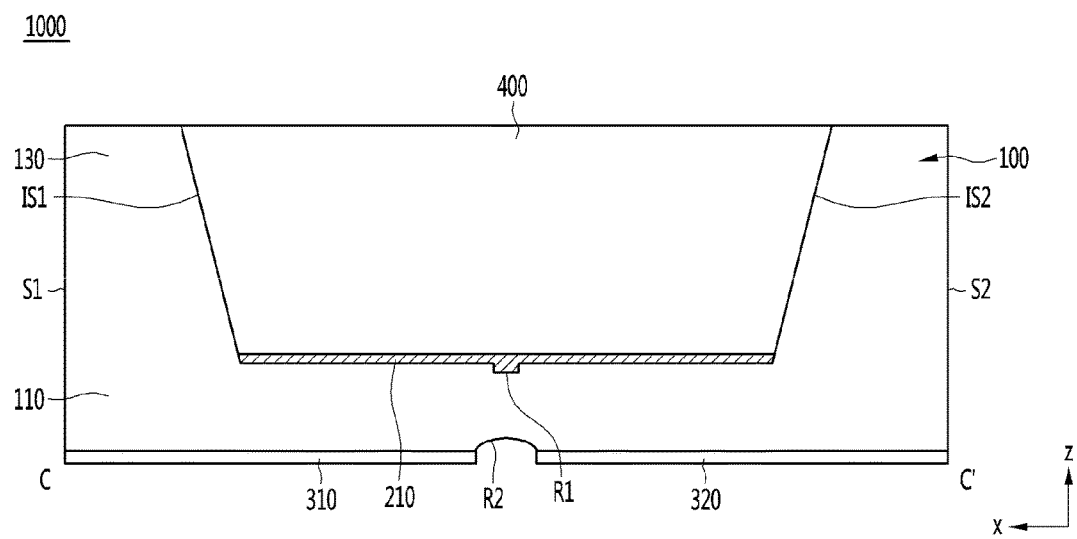
[Fig. 8]
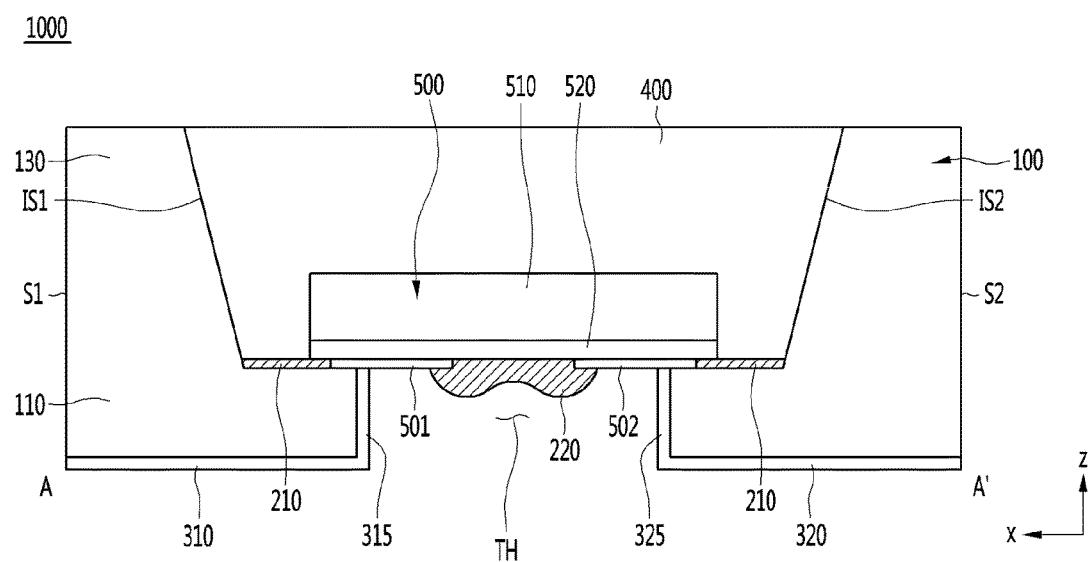

【Fig. 9】
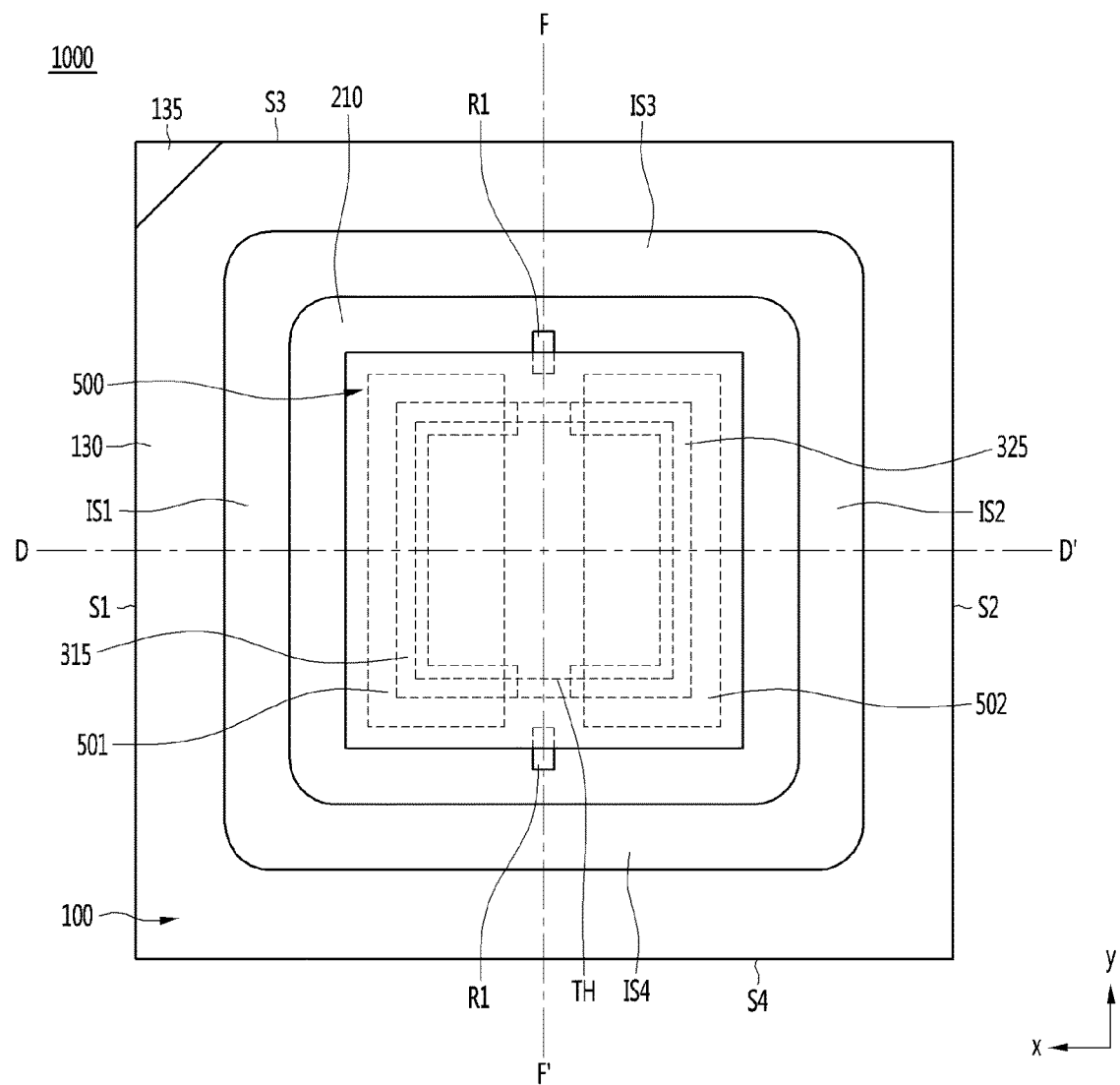

【Fig. 10】
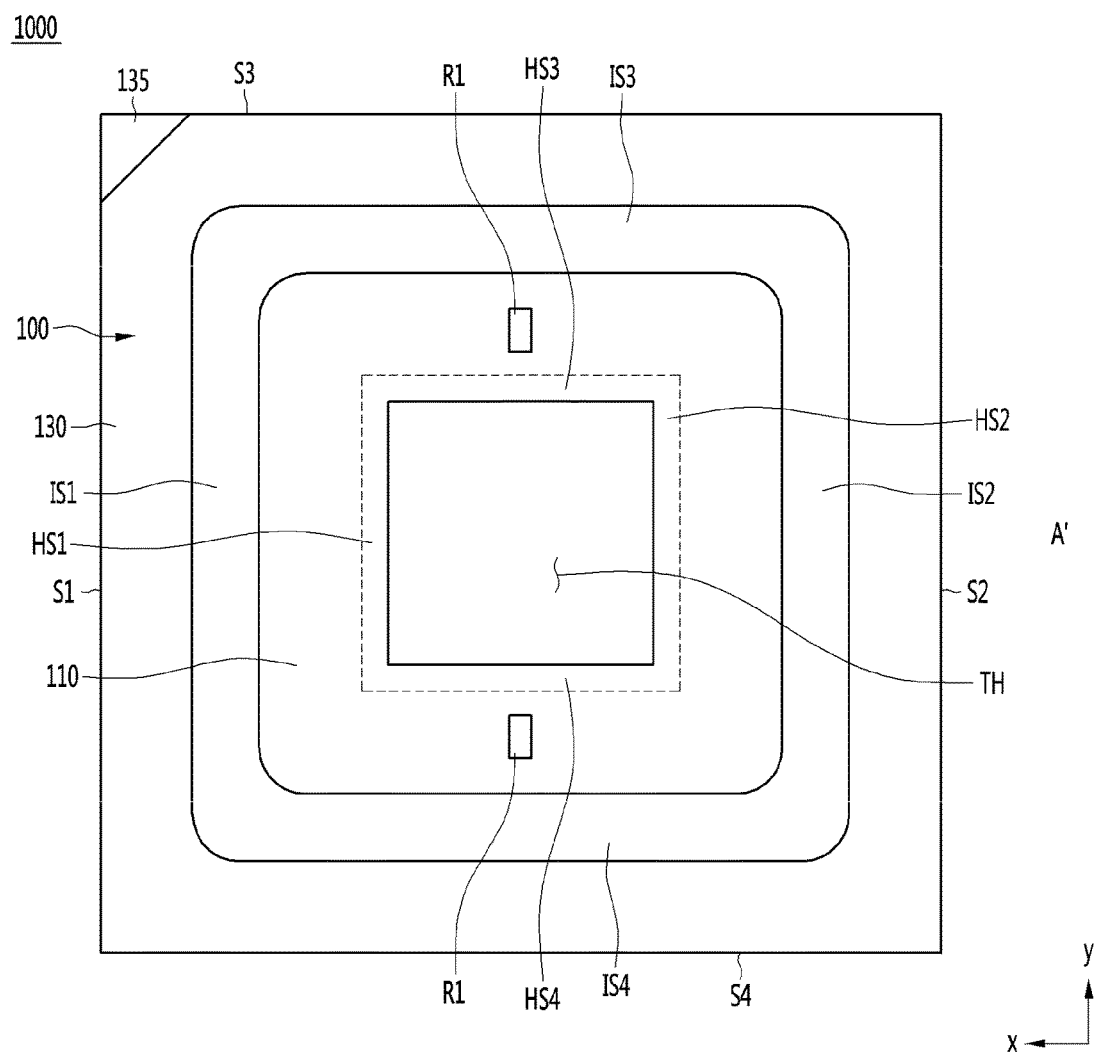

[Fig. 11]
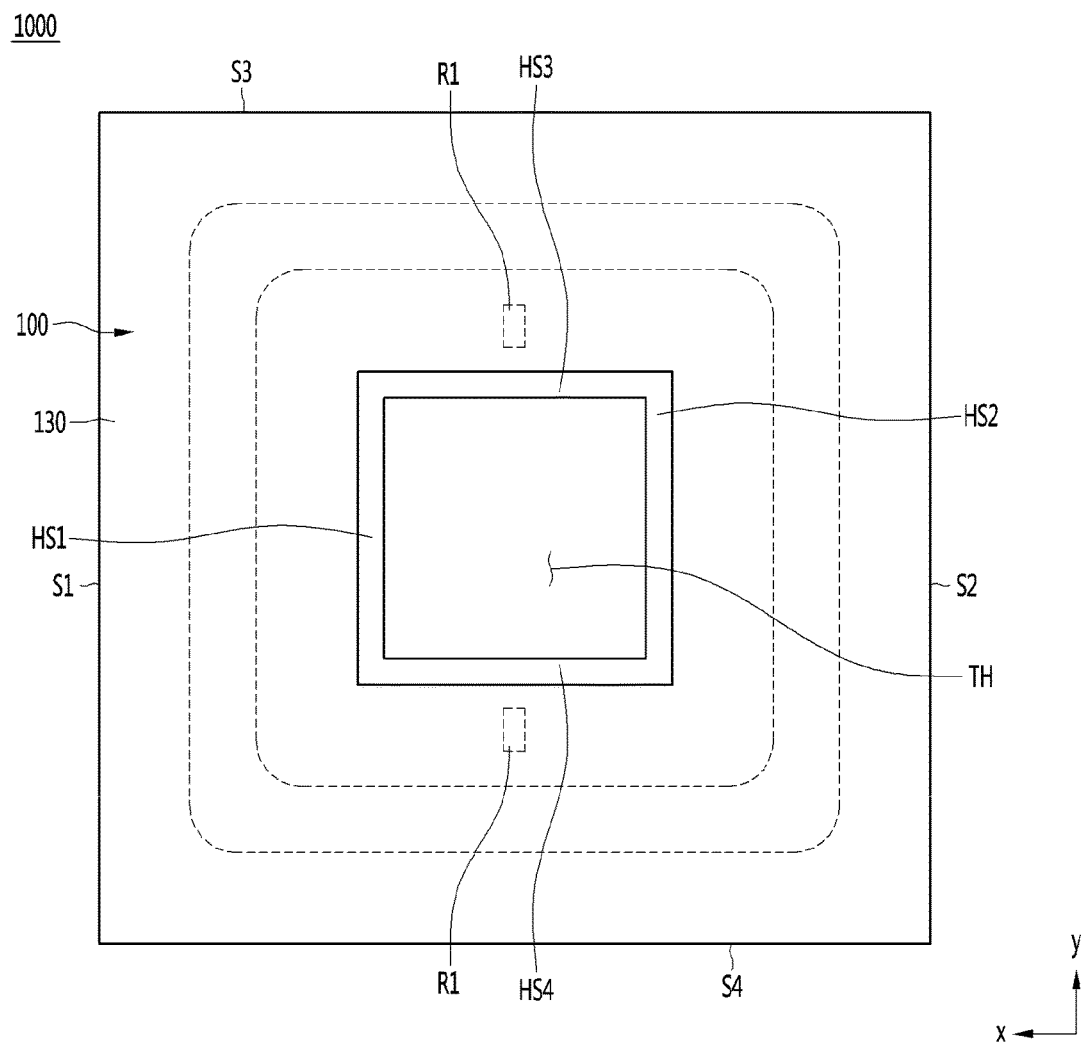

[Fig. 12]
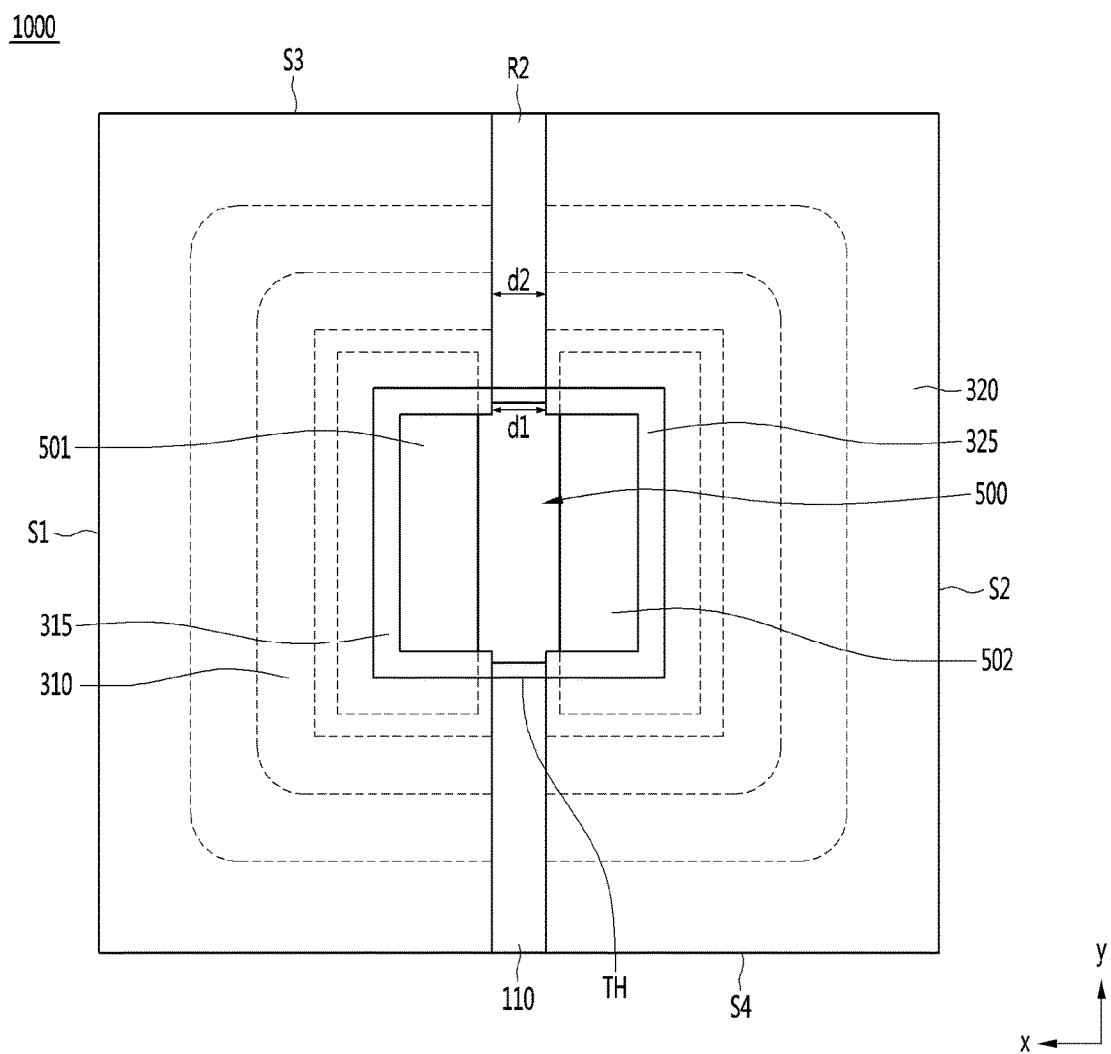

[Fig. 13]
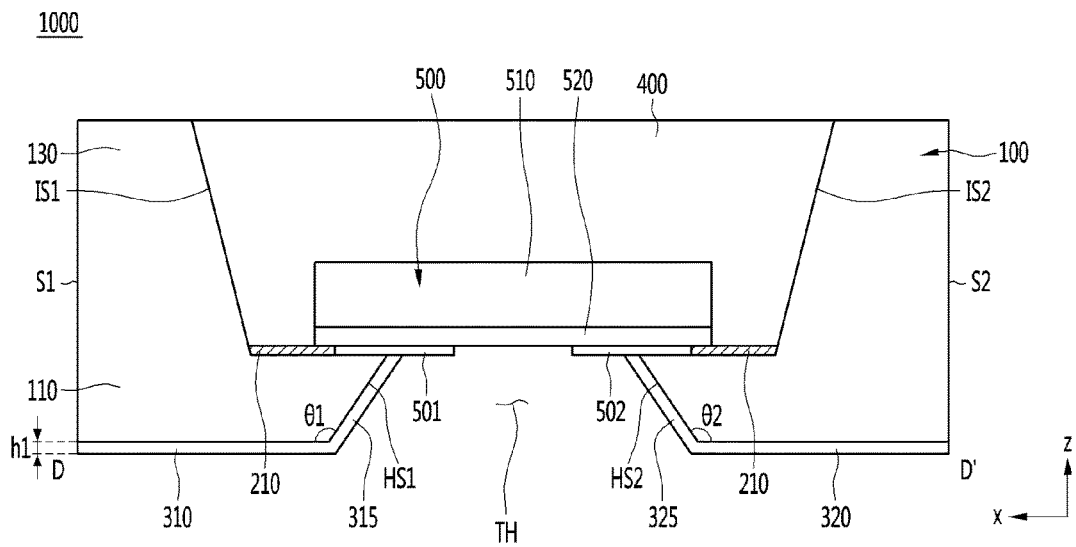
[Fig. 14]
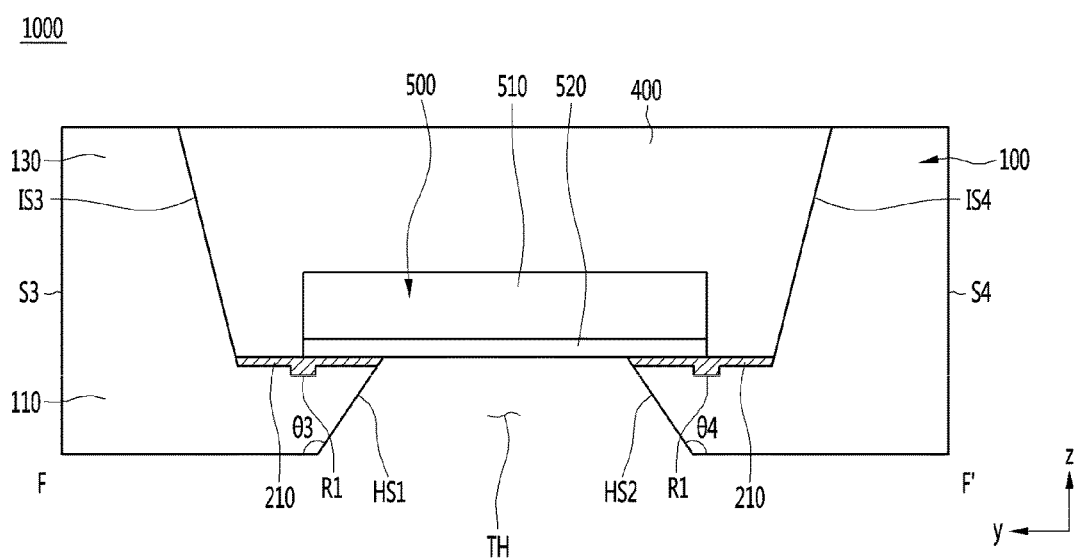

[Fig. 15]
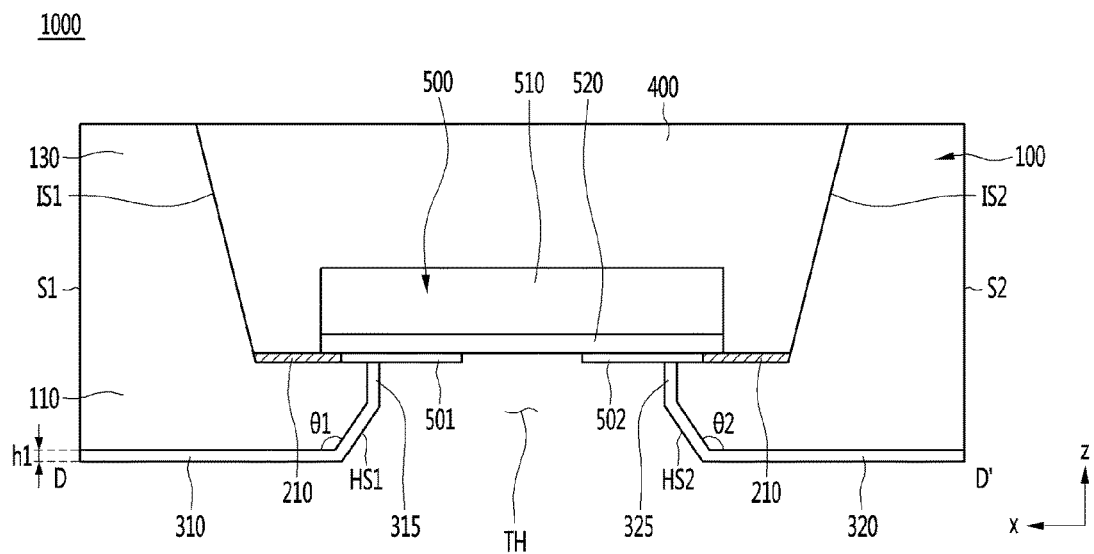
[Fig. 16]
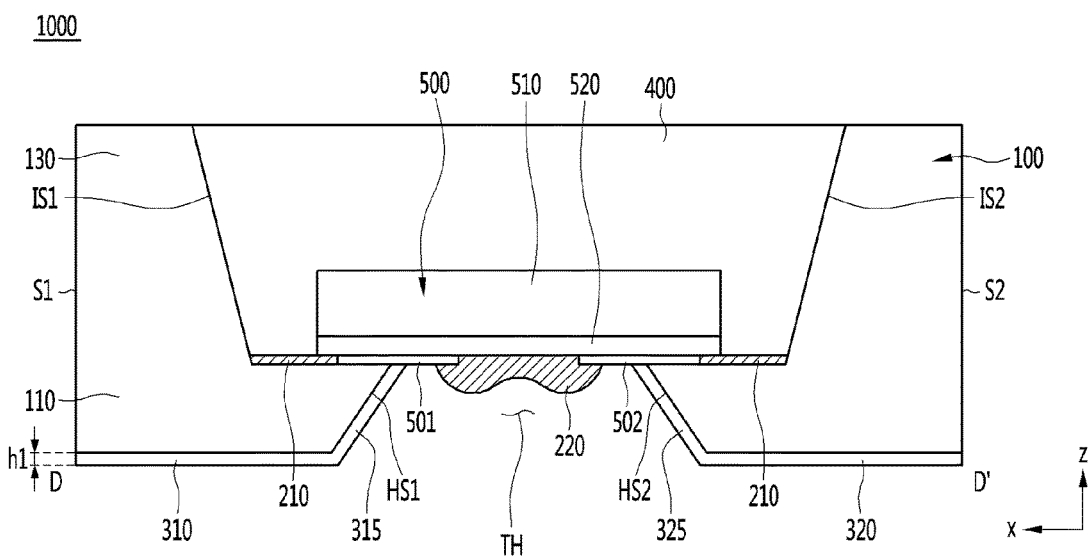

[Fig. 17]
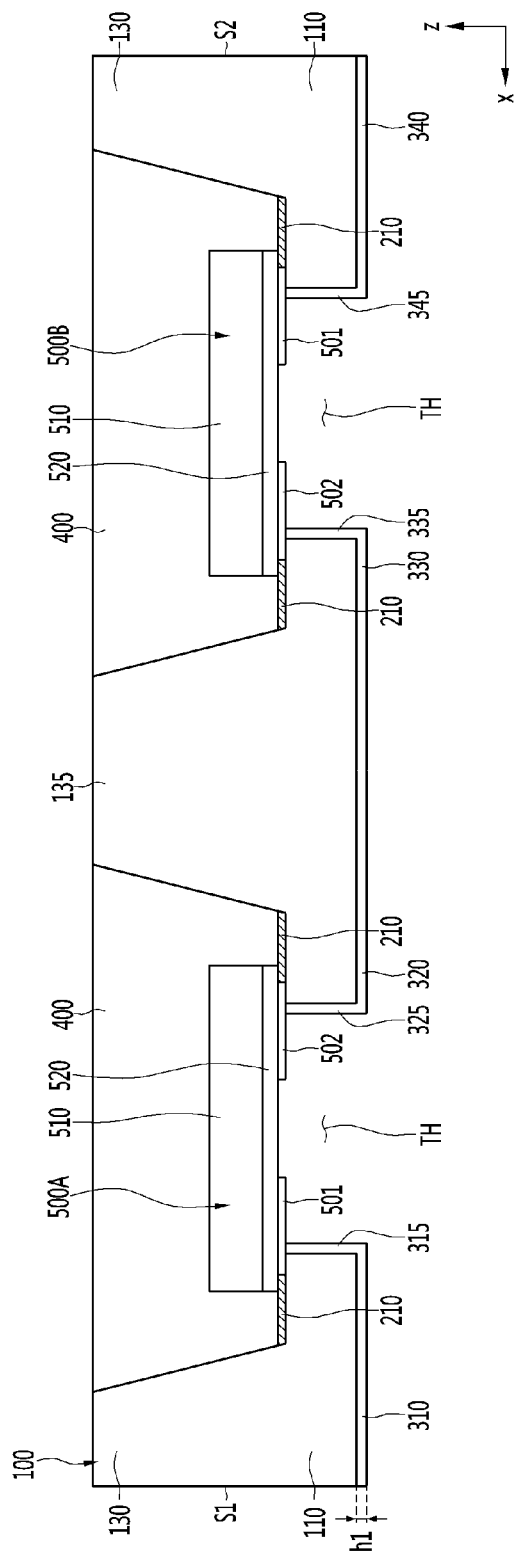

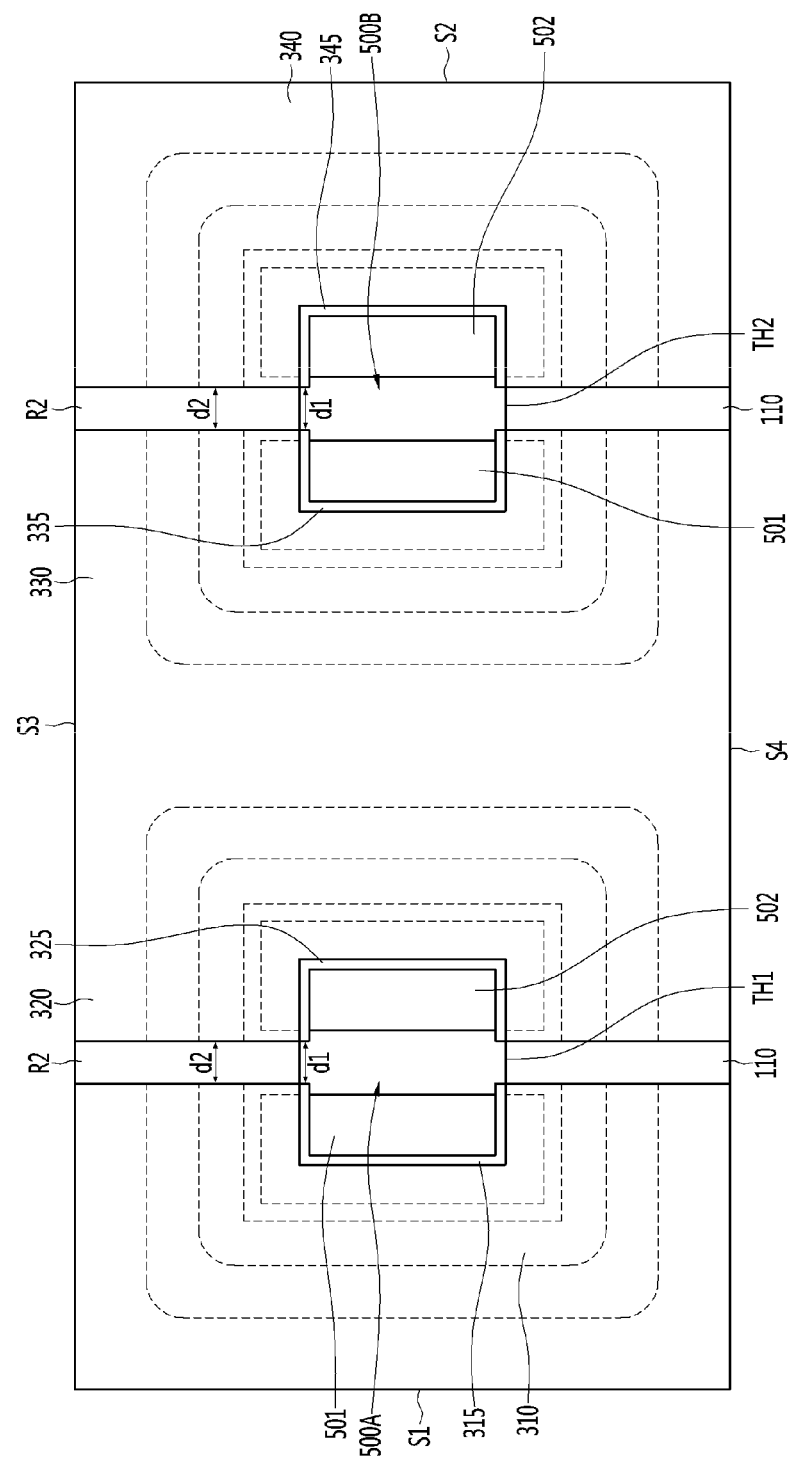
[Fig. 18]

[Fig. 19]
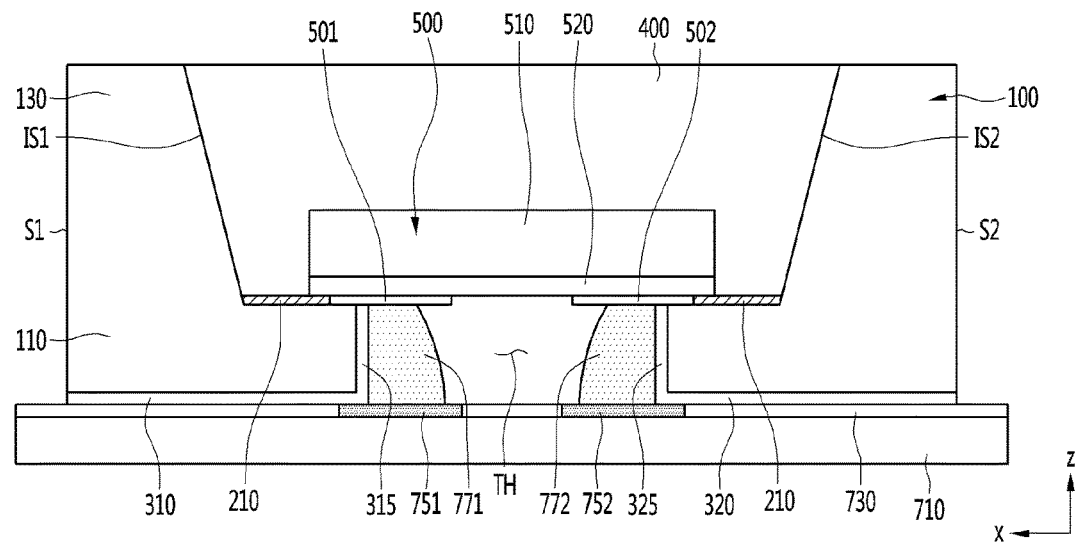
[Fig. 20]
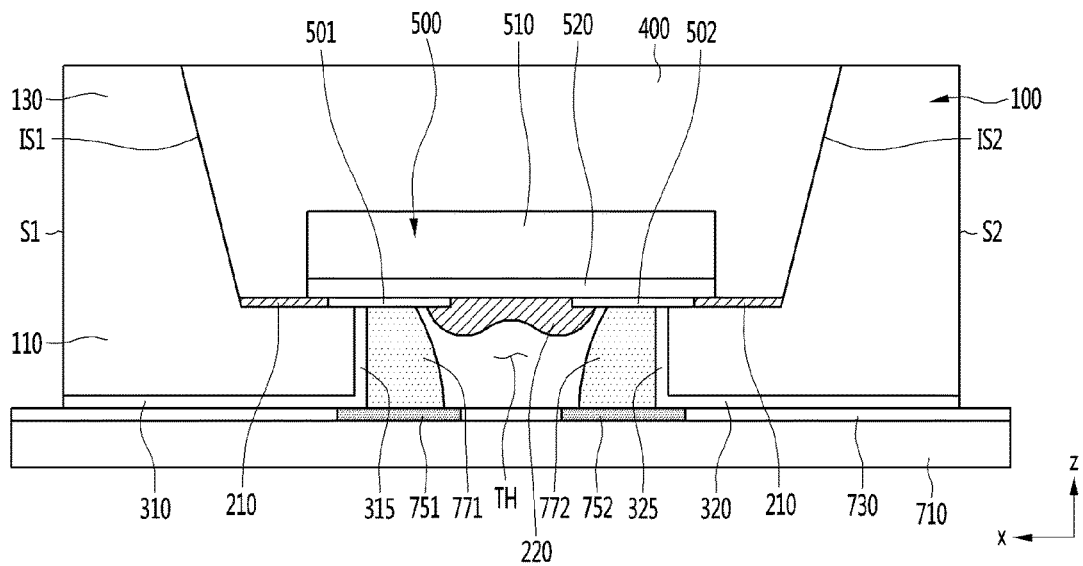

[Fig. 21]
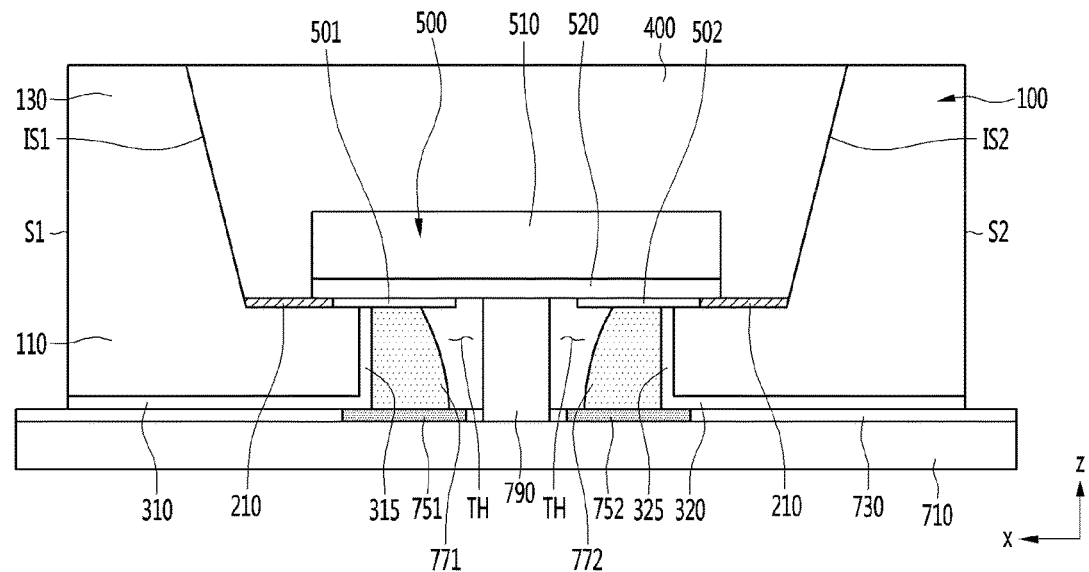
[Fig. 22]
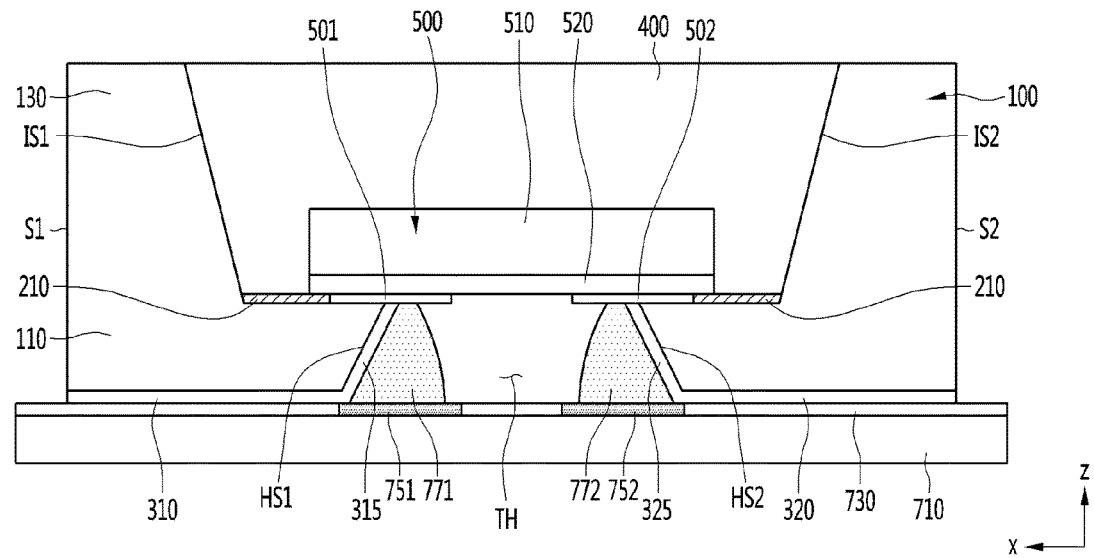

[Fig. 23]
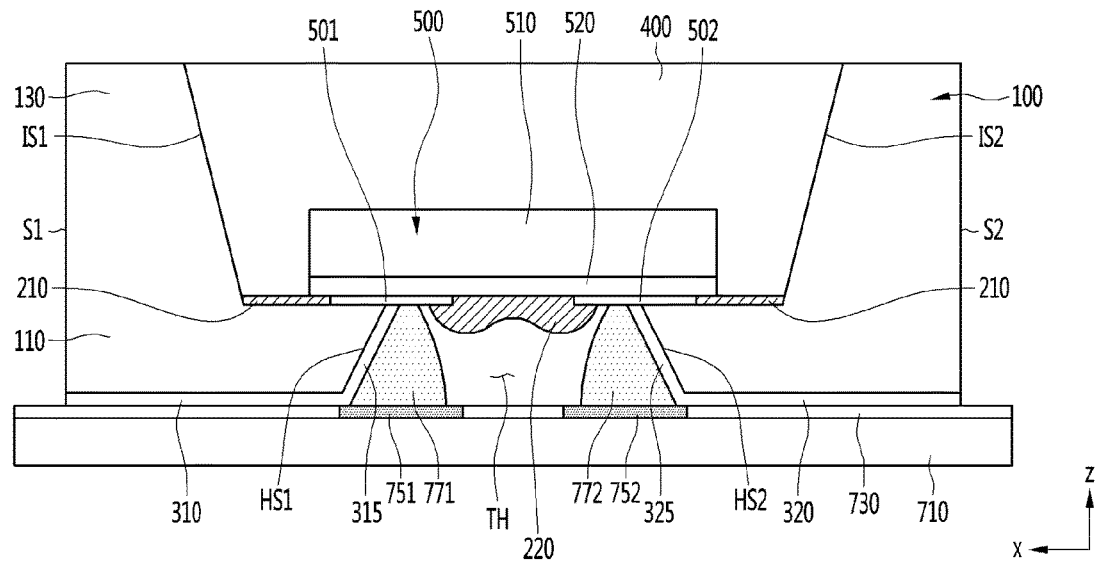
[Fig. 24]
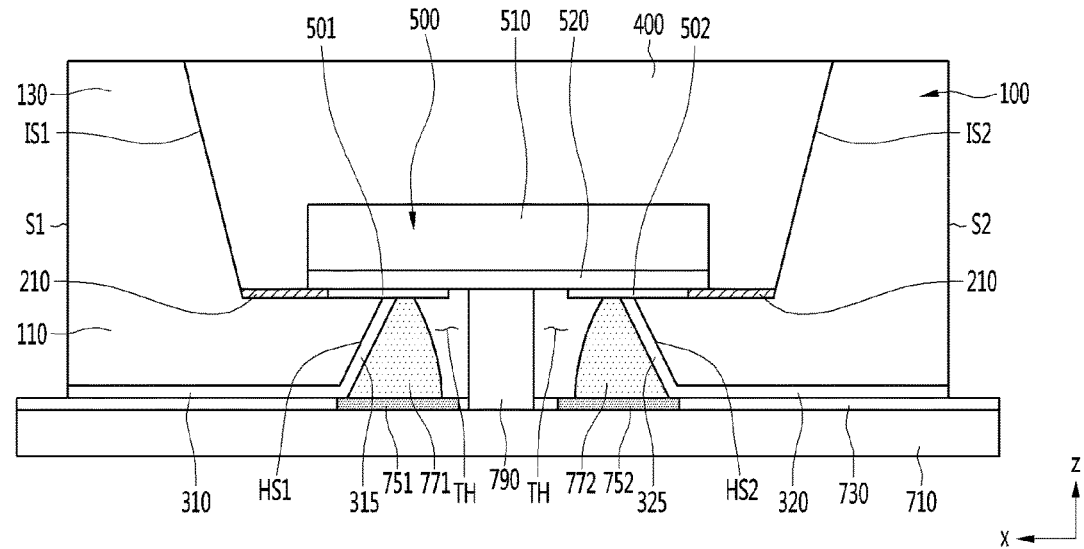

[Fig. 25]
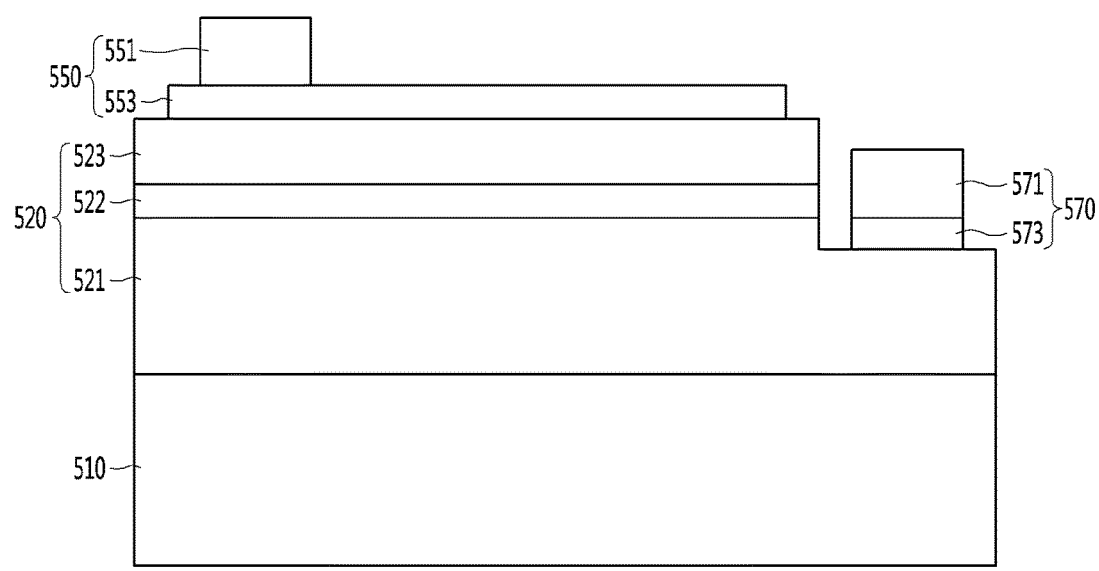

LIGHT-EMITTING DEVICE PACKAGE AND LIGHT SOURCE MODULE

CROSS REFERENCE TO RELATED APPLICATIONS

This application is the National Phase of PCT International Application No. PCT/KR2019/006417, filed on May 29, 2019, which claims priority under 35 U.S.C. 119(a) to Patent Application No. 10-2018-0061494, filed in the Republic of Korea on May 30, 2018, all of which are hereby expressly incorporated by reference into the present application.

TECHNICAL FIELD

An embodiment relates to a light-emitting device package and a light source module including the same.

BACKGROUND ART

A semiconductor device including compounds such as GaN and AlGaN has a lot of advantages such as having wide and easily adjustable band gap energy and may be used variously as a light-emitting device, a light-receiving device, and various diodes.

In particular, a light-emitting device such as a light-emitting diode or a laser diode using a compound semiconductor material of Group III-V or Group II-VI of a semiconductor has an advantage that may realize light of various wavelength bands such as red, green, blue, and ultraviolet rays by development of thin film growth technology and device materials. In particular, a light-emitting device such as a light-emitting diode or a laser diode using a compound semiconductor material of Group III-V or Group II-VI of a semiconductor may realize a white light source with high efficiency by using fluorescent materials or combining colors. Such a light-emitting device has advantages of low power consumption, semi-permanent lifetime, fast response speed, safety, and environmental friendliness as compared with conventional light sources such as fluorescent lamps and incandescent lamps.

In addition, when a light-receiving device such as a photodetector or a solar cell is manufactured using a compound semiconductor material of Group III-V or Group by developing device materials, light of various wavelength regions from gamma rays to a radio wavelength region may be utilized by absorbing light of various wavelength regions and generating a photocurrent. In addition, such a light-receiving device has advantages of fast response speed, safety, environmental friendliness and easy control of device materials, so that it may be easily used for power control or a microwave circuit or communication module.

Accordingly, a semiconductor device has been expanded to a transmitting module of an optical communication means, a light-emitting diode backlight which replaces a cold cathode fluorescent lamp (CCFL) constituting a backlight of a liquid crystal display (LCD) device, white light-emitting diode lighting device which may replace the fluorescent lamp or the incandescent lamp, automotive headlights, traffic lights, and even sensors sensing gas or fire. In addition, the semiconductor device may be extended to high-frequency application circuits or other power control devices, and even communication modules.

A light-emitting device (LED) may be provided, for example, as a p-n junction diode having a characteristic in which electric energy is converted into light energy by using Group III-V or Group II-V elements on the periodic table, and may realize various wavelengths by adjusting a composition ratio of a compound semiconductor.

For example, a nitride semiconductor has received a great interest in a development field of an optical device and a high-power electronic device due to high thermal stability and wide band gap energy thereof. In particular, an ultraviolet (UV) LED, a blue LED, a green LED, a yellow LED, a red LED, and the like using the nitride semiconductor are commercialized and used widely.

For example, an ultraviolet light-emitting device is a light-emitting diode that emits light distributed in a wavelength band of 200 nm to 400 nm, in the wavelength band, a short wavelength may be used for sterilization, purification, or the like, and a long wavelength may be used for an exposure apparatus, a curing apparatus, or the like.

Ultraviolet rays may be classified into three categories of UV-A 315 nm to 400 nm), UV-B 280 nm to 315 nm), and UV-C 200 nm to 280 nm) in a descending order of wavelength. The UV-A 315 nm to 400 nm) region is applied to various fields such as industrial UV curing, printing ink curing, an exposure apparatus, counterfeit discrimination, photocatalytic sterilization, a special lighting system (aquarium/agriculture, etc.), and the like. The UV-B 280 nm to 315 nm) region is used for medical applications, and the UV-C 200 nm to 280 nm) region is applied to air purification, water purification, sterilization products, and the like.

Meanwhile, as a semiconductor device capable of providing high output is required, research on a semiconductor device capable of increasing output by applying high power is being conducted.

In addition, in a light-emitting device package, research is being conducted on a method capable of improving the reliability of the package.

In addition, in a light-emitting device package, research is being conducted on a method capable of improving light extraction efficiency of a light-emitting device and improving brightness at a package stage.

In addition, in a light-emitting device package, research is being conducted on a method capable of improving a bonding force between a light-emitting device and the package and a method capable of effectively discharging a heat emitted from the light-emitting device.

In addition, in manufacture of a light-emitting device package. research is being conducted on a method for reducing a manufacturing cost and improving a manufacturing yield by changing a structure thereof.

DISCLOSURE

Technical Problem

An object of an embodiment is to provide a light-emitting device package and a light source module capable of effectively discharging heat emitted from a light-emitting device.

Another object of an embodiment is to provide a light-emitting device package and a light source module capable of improving reliability and improving light efficiency by preventing the light-emitting device from being tilted in the light-emitting device package.

In addition, still another object of an embodiment is to provide a light-emitting device package and a light source module capable of improving a bonding force and electrical characteristics between the light-emitting device package and a substrate.

In addition, still another object of an embodiment is to provide a light-emitting device package and a light source module capable of blocking electrical interference between a bonding portion and a conductive portion.

In addition, yet another object of an embodiment is to provide a light-emitting device package and a light source module capable of preventing a phenomenon in which a bonding region thereof is re-melted while the package is bonded to a substrate.

Technical Solution

A light-emitting device package according to an embodiment includes a body including a through-hole passing through an upper surface and a lower surface thereof, a light-emitting device disposed on the upper surface of the body and including first and second bonding portions spaced apart from each other, and first and second metal portions disposed to be spaced apart from each other on a rear surface of the body, wherein a partial region of each of the first and second bonding portions is overlapped with the through-hole in a vertical direction, each of the first and second metal portions includes first and second extension portions extending to the through-hole, each of the first and second extension portions is electrically connected to the first and second bonding portions, respectively, and the first and second extension portions face each other in the through-hole.

Advantageous Effects

An embodiment includes a body including a through-hole, and metal portions may be disposed on the rear surface of the body and the inner side surface of the through-hole to provide a heat dissipation path. Accordingly, the heat emitted from the light-emitting device may be effectively discharged, and the reliability of the light-emitting device package may be improved.

In addition, in the embodiment, a first resin may be disposed between the lower portion of the light-emitting device and the body, and adhesive force and holding force between the light-emitting device and the body may be improved. In addition, a first recess may be formed on the first body, and the first recess may provide a position for arranging the light-emitting device. Further, the supply amount of the first resin may be adjusted by the first recess, and the adhesive force between the light-emitting device and the body may be improved.

In addition, the bonding portion according to the embodiment may be connected to a metal portion and a conductive portion through the through-hole of the body. Specifically, the conductive portion may be effectively supplied through the metal portion disposed in the through-hole, and the adhesive strength and electrical characteristics of the bonding portion of a flip chip may be improved.

In addition, the inner surface of the through-hole according to the embodiment may be formed in an inclined manner, and the metal portion may be uniformly formed on the inner surface due to the inclined structure. Accordingly, the conductive portion may be smoothly supplied, and the contact area between the conductive portion and the bonding portion may be maximized to improve the bonding force.

Further, since the inner surface in the through-hole is inclined, it is possible to block electrical interference between the conductive portions connected to each of the bonding portions. Accordingly, it possible to improve the electrical characteristics of the light-emitting device package.

In addition, in the embodiment, a second resin layer or a partition wall portion may be further disposed between the first and second bonding portions. Accordingly, it is possible to effectively block the electrical interference between the conductive portions connected to each of the bonding portions.

In addition, in the embodiment, it is possible to prevent the body from being damaged such as discoloration or deformation in a high temperature environment in the process of manufacturing the light-emitting device package, and it is possible to prevent a phenomenon that a bonding region between the light-emitting device and the package body is re-melted while the light-emitting device package is bonded to a substrate or the like.

DESCRIPTION OF DRAWINGS

FIG. 1 is a perspective view of a light-emitting device package according to an embodiment.

FIG. 2 is a plan view of a body of a light-emitting device package according to an embodiment.

FIG. 3 is a plan view of a light-emitting device package according to an embodiment.

FIG. 4 is a rear view of a light-emitting device package according an embodiment.

FIG. 5 is a cross-sectional view taken along line A-A' of the light-emitting device package of FIG. 3.

FIG. 6 is a cross-sectional view taken along line B-B' of the light-emitting device package of FIG. 3.

FIG. 7 is a cross-sectional view taken along line C-C' of the light-emitting device package of FIG. 3.

FIG. 8 is a cross-sectional view showing an example in which a second resin is further disposed in the light-emitting device package of FIG. 2.

FIG. 9 is a plan view showing a modified example of the light-emitting device package of FIG. 2.

FIG. 10 is a view showing a plan view of a body of the light-emitting device package of FIG. 9.

FIG. 11 is a view showing a rear view of the body of the light-emitting device package of FIG. 9.

FIG. 12 is a rear view of the light-emitting device package of FIG. 9.

FIG. 13 is a cross-sectional view taken along line D-D' of the light-emitting device package of FIG. 9.

FIG. 14 is a cross-sectional view taken along line F-F' of the light-emitting device package of FIG. 9.

FIG. 15 is a cross-sectional view showing a modified example of the light-emitting device package of FIG. 9.

FIG. 16 is a cross-sectional view showing an example in which a second resin is further disposed in the light-emitting device package of FIG. 9.

FIGS. 17 and 18 are a cross-sectional view and a rear view showing a light-emitting device package including a plurality of light-emitting devices.

FIGS. 19 to 24 are views showing an example in which a light-emitting device package according to an embodiment is disposed on a circuit board.

FIG. 25 is a side sectional view showing an example of a light-emitting device applied to a light-emitting device package according to an embodiment.

MODES OF THE INVENTION

Embodiments of the present invention will be described with reference to the accompanying drawings. In the description of the embodiments of the present invention, it will be understood that when a layer (or film), region, pattern or structure is referred to as being "on/over" or "under" another substrate, layer (or film), region, pad or pattern, the terminologies of "on/over" and "under" include both the meanings of "directly" and "by interposing another layer (indirectly)". Further, the reference with respect to on/over" or "under" each layer will be described with reference to the drawings, but is not limited to the embodiments.

A semiconductor device package according to an embodiment of the present invention will be described in detail with reference to the accompanying drawings. The semiconductor device package of the present invention may include a semiconductor device or a light-emitting device that emits ultraviolet light, infrared rays, or visible light. Hereinafter, it will be described based on a case in which a light-emitting device is applied as an example of a semiconductor device, and a package or a light source device to which the light-emitting device is applied may include a non-light-emitting device, for example, an element such as a Zener diode, or a sensing element monitoring a wavelength or heat. Hereinafter, it will be described based on a case in which the light-emitting device is applied will be described as an example of the semiconductor device, and the light-emitting device package will be described in detail.

In addition, prior to describing the light-emitting device package according to the embodiment of the invention, a first direction may be an x-axis direction shown in the drawings, and a second direction may be a y-axis direction shown in the drawings, and may be a direction orthogonal to the x-axis direction. Further, a third direction may be a z-axis direction shown in the drawings, and may be a direction orthogonal to the x-axis and the y-axis.

FIG. 1 is a perspective view of a light-emitting device package according to an embodiment, FIG. 2 is a plan view of a body of a light-emitting device package according to an embodiment, FIG. 3 is a plan view of a light-emitting device package according to an embodiment, FIG. 4 is a rear view of a light-emitting device package according an embodiment, FIG. 5 is a cross-sectional view taken along line A-A' of the light-emitting device package of FIG. 3, FIG. 6 is a cross-sectional view taken along line B-B' of the light-emitting device package of FIG. 3, and FIG. 7 is a cross-sectional view taken along line C-C' of the light-emitting device package of FIG. 3.

Referring to FIGS. 1 to 7, a light-emitting device package 1000 according to an embodiment may include a body 100, a light-emitting device 500, and a metal portion 300.

The light-emitting device package 1000 may have lengths in a first direction and a second direction. Specifically, the light-emitting device package 1000 may have lengths in the first direction and the second direction orthogonal to the first direction. The length of the light-emitting device package 1000 in the first direction may be the same as or different from the length of the second direction. For example, the length of the light-emitting device package 1000 in the first direction will be longer than or equal to the length in the second direction.

The body 100 may be made of a resin material or an insulating resin material. The body 100 may be formed of at least one selected from the group consisting of polyphthalamide (PPA), polychloro triphenyl (PCT), liquid crystal polymer (LCP), polyamide9T (PA9T), silicone, epoxy, epoxy molding compound (EMC), silicone molding compound (SMC), ceramic, photo sensitive glass (PSG), sapphire ($Al_2O_3$), and the like. The body 100 may be made of a resin material and may contain a filler of a high refraction material such as $TiO_2$ and $SiO_2$. The body 100 may be formed of a thermoplastic resin, and since the thermoplastic resin is a material that recedes when heated and hardens again when cooled, the body 100 may act as a buffer when the metal portion 300 described later and materials in contact therewith expand or contract. At this time, when the body 100 acts as the buffer, it is possible to prevent a conductive portion such as a solder paste, a silver (Ag) paste, and a SAC (Sn—Ag—Cu) paste from being damaged. The coefficient of thermal expansion (CTE) according to the thermal expansion and contraction of the package may be larger in the first direction than in the second direction. The body 100 according to the embodiment may include a PCT or PPA material which is a thermoplastic resin having a high melting point.

An electrode position indicator 135 may be formed at polychloride least one of four corners of an upper end portion of the body 100. For example, the electrode position indicator 135 may be formed for indicating at least one polarity of the cathode or the anode, and may be formed by cutting one corner of the body 100 in a stepped shape.

The body 100 may include a plurality of side surfaces. Specifically, the body 100 may include a first side surface S1 and a second side surface S2 facing each other in the first direction, and may include a third side surface S3 and a fourth side surface S4 facing each other in the second direction. The third side surface S3 and the fourth side surface S4 may be a side surface that connects the first side surface S1 and the second side surface S2. For example, the third side surface S3 may be extended in the first direction from one end of the first side surface S1 to be connected to one end of the second side surface S2. Further, the fourth side surface S4 may be extended in the first direction from the other end of the first side surface S1 to be connected to the other end of the second side surface S2. The first to fourth side surfaces S1, S2, S3, and S4 may be a surface perpendicular or inclined with respect to a rear surface of the body 100.

A length of the body 100 in the first direction may be different from or the same as a length in the second direction. For example, when the length in the first direction of the light-emitting device package 1000 is longer than the length in the second direction thereof, the length in the first direction of the body 100 may be longer than the length in the second direction. That is, lengths in the second direction of the first and second side surfaces S1 and S2 may be shorter than lengths in the first direction of the third and fourth side surfaces S3 and S4. Further, when the lengths in the first and second directions of the light-emitting device package 1000 are the same, the lengths of the body 100 in the first and second directions may be the same. That is, the lengths in the first direction or the second direction of the first to fourth side surfaces S1, S2, S3, and S4 may be the same as each other.

The body 100 may include a first body 110 and a second body 130. For example, the body 100 may include the first body 110 and the second body 130 disposed on the first body 110. The second body 130 may be disposed around an upper surface of the first body 110. The second body 130 may provide an inclined surface on the first body 110. Accordingly, the second body 130 may provide a cavity 150 on the upper surface of the first body 110. Here, the second body 130 may be referred to as an upper body. That is, the second body 130 may be a side wall that provides the cavity 150. The first body 110 and the second body 130 may be formed integrally or separately. When the first body 110 and the second body 130 are formed separately, an adhesive material is applied between the first body 110 and the second body 130 to be coupled to each other.

The second body 130 may include inclined side surfaces IS1, IS2, IS3, and IS4 around the cavity 150. The inclined side surfaces IS1, IS2, IS3, and IS4 may be an inner surface of the second body 130. The inclined side surfaces IS1, IS2, IS3, and IS4 may be inner surfaces inclined in the first and second directions. For example, the second body 130 may include a first inner surface IS1 and a second inner surface IS2 inclined in the first direction, and may include a third inner surface IS3 and a fourth inner surface IS4 inclined in the second direction. Inclination angles of the first inner surface IS1 and the second inner surface IS2 may correspond to each other. That is, the first and second inner surfaces IS1 and IS2 may have inclination angles corresponding to each other with respect to the upper surface of the first body 110. Further, inclination angles of the third inner surface IS3 and the fourth inner surface IS4 may correspond to each other. That is, the third and fourth inner surfaces IS3 and IS4 may have inclination angles corresponding to each other with respect to the upper surface of the first body 110. The inclination angles of the first to fourth inner surfaces IS1, IS2, IS3, and IS4 may correspond to each other. For example, when the lengths in the first direction and the second direction of the body 100 correspond to each other, the first to fourth inner surfaces IS1, IS2, IS3, and IS4 may have inclined surfaces with the same inclination angle as each other. Alternatively, when the length in the first direction and the length in the second direction of the body 100 are different from each other, the inclination angles of the first and second inner surfaces IS1 and IS2 may be different from the inclination angles of the third and fourth inner surfaces IS3 and IS4.

A thickness of the first body 110 may be about 400 μm or less. Specifically, the thickness of the first body 110 may be about 80 μm to about 400 μm. More specifically, the thickness of the first body 110 may be about 100 μm to about 300 μm.

In addition, the total thickness of the body 100 may be about 100 μm or more. Specifically, the thickness of the body 100 may be about 100 μm to about 800 μm. The thickness of the body 100 may refer to a sum of the thickness of the first body 110 and a thickness of the second body 130. The thickness of the second body 130 may be thicker than that of the light-emitting device 500. An upper surface of the second body 130 may be disposed at the same position as or higher than an upper surface of the light-emitting device 500 for a light directional angle distribution. Alternatively, although not shown in the drawings, the second body 130 may be removed from the first body 110. Accordingly, the light-emitting device package may have a light directional angle distribution of 130 degrees or more.

The body 100 may include a through-hole TH. Specifically, the first body 110 may include a through-hole TH. The through-hole TH may be disposed in the cavity 150. The through-hole TH may be disposed at a position corresponding to the cavity 150 in a vertical direction. The through-hole TH may be a hole that passes through the upper surface and the lower surface of the first body 110. A depth of the through-hole TH may correspond to a height of the first body 110.

The through-hole TH may be provided at a depth at which the first body 110 may maintain stable strength. For example, the depth of the through-hole TH may be about 400 μm or less. Specifically, the depth of the through-hole TH may be about 80 μm to about 400 μm. More specifically, the depth of the through-hole TH may be about 100 μm to about 300 μm.

A width of the through-hole TH may be uniform. Specifically, a width of an upper region of the through-hole TH may correspond to a width of a lower region of the through-hole TH. That is, the through-hole TH may have a uniform width and may pass through the upper surface and the lower surface of the first body 110.

An inner surface of the through-hole TH may have an inclination angle with respect to the upper surface and/or the rear surface of the body 100. For example, the inner surface of the through-hole TH may have an inclination angle perpendicular to the upper surface and/or the rear surface of the body 100.

The through-hole TH may have a polygonal shape. For example, when viewing it in a plane, the through-hole TH may have a quadrangular shape. However, the embodiment is not limited thereto, and the through-hole TH may have various shapes. For example, the through-hole TH may have at least one of a polygonal shape, a circular shape, an elliptical shape, and an atypical shape having a straight line and a curved line. In addition, a shape of the upper region of the through-hole TH may be the same as or different from a shape of the lower region of the through-hole TH. In the embodiment, the through-hole TH has been described as having a quadrangular shape, but the embodiment is not limited thereto, and the through-hole TH may have one shape to be selected from the above-described shapes.

The through-hole TH may include a plurality of inner surfaces. For example, the through-hole TH may include a first inner surface and a second inner surface facing each other in the first direction. Further, the through-hole TH may include a third inner surface and a fourth inner surface facing each other in the second direction. The third and fourth inner surfaces may be surfaces connecting the first and second inner surfaces.

An area of the through-hole TH may be smaller than that of the light-emitting device 500. For example, when viewing it in a plane, the area of the through-hole TH may be smaller than that of the light-emitting device 500. Specifically, the area of the upper region of the through-hole TH may be smaller than that of a rear surface of the light-emitting device 500. The area of the upper region of the through-hole TH may be about 60% to about 95% of the area of the light-emitting device 500. Specifically, the area of the upper region of the through-hole TH may be about 70% to about 95% of the area of the light-emitting device 500. The area of the light-emitting device 500 may refer to an area of a surface facing the through-hole TH, for example, an area of the rear surface. When the area of the upper region of the through-hole TH is less than about 60% with respect to the area of the light-emitting device 500, conductive portions 771 and 772 to be described later may not be supplied smoothly in the through-hole TH. Further, when the area exceeds about 95%, a part of the light-emitting device 500 may be disposed to be inserted into the through-hole TH, and light efficiency may be lowered. Therefore, it is desirable that the area of the upper region of the through-hole TH satisfies the above-described range.

The light-emitting device 500 may be disposed on the body 100. The light-emitting device 500 may be disposed on the upper surface of the first body 110. The light-emitting device 500 may be disposed in the cavity 150. The light-emitting device 500 may include a substrate 510, a light-emitting structure 520, and a first bonding portion 501 and a second bonding portion 502 disposed on the rear surface of the light-emitting device 500.

The substrate 510 may be formed of an insulating material or a semiconductor material as a light-transmitting layer. Further, the substrate 510 may have an uneven pattern formed on a surface thereof.

The light-emitting structure 520 may include a compound semiconductor. For example, the light-emitting structure 520 may be provided as, for example, a Group II-VI or Group III-V compound semiconductor.

The light-emitting structure 520 may include a first conductive type semiconductor layer 521, an active layer 522, and a second conductive type semiconductor layer 523. The first conductive type semiconductor layer 521 and the second conductive type semiconductor layer 523 may be implemented as at least one of the Group II-VI or Group III-V compound semiconductors. Further, the active layer 522 may be implemented as a compound semiconductor. The active layer 522 may be implemented as, for example, at least one of the Group III-V or Group II-VI compound semiconductors.

The light-emitting device 500 may include one or a plurality of light-emitting cells therein. The light-emitting cell may include at least one of an n-p junction, a p-n junction, an n-p-n junction, and a p-n-p junction. The plurality of light-emitting cells may be connected in series with each other in one light-emitting device. Accordingly, the light-emitting device 500 may have one or the plurality of light-emitting cells, and when n light-emitting cells are disposed in one light-emitting device, it may be driven by n times a driving voltage. For example, when the drive voltage of one light-emitting cell is 3V and two light-emitting cells are disposed in one light-emitting device, each light-emitting device may be driven by a driving voltage of 6V. Alternatively, when the drive voltage of one light-emitting cell is 3V and three light-emitting cells are disposed in one light-emitting device, each light-emitting device may be driven by a driving voltage of 9V. The number of light-emitting cells disposed in the light-emitting device 500 may be one or two to five. The light-emitting device 500 will be described in more detail with reference to FIG. 25 which will be described later.

The first bonding portion 501 and the second bonding portion 502 may be disposed on the rear surface of the light-emitting device 500. The first bonding portion 501 may be disposed at a position vertically overlapped with the light-emitting device 500, and may be electrically connected to the first conductive type semiconductor layer 521. Further, the second bonding portion 502 may be disposed at a position vertically overlapped with the light-emitting device 500, and may be electrically connected to the second conductive type semiconductor layer 523. At this time, the first bonding portion 501 and the second bonding portion 502 may be disposed to be spaced apart from each other. For example, the first bonding portion 501 and the second bonding portion 502 may be disposed to be spaced apart from each other in the first direction. Accordingly, a gap may be formed between the first bonding portion 501 and the second bonding portion 502.

The light-emitting device 500 may be disposed in the cavity 150. Specifically, the light-emitting device 500 may be disposed on the upper surface of the first body 110 exposed by the cavity 150. The light-emitting device 500 may be disposed on the through-hole TH. The light-emitting device 500 may be disposed at a position corresponding to the through-hole TH in the vertical direction. The light-emitting device 500 may have lengths in the first direction and the second direction. For example, the length of the light-emitting device 500 in the first direction may be longer than that of the through-hole TH in the first direction. Further, the length of the light-emitting device 500 in the second direction may be longer than that of the through-hole TH in the second direction.

The first and second bonding portions 501 and 502 may be disposed on the through-hole TH. The first and second bonding portions 501 and 502 may be disposed at positions corresponding to the through-hole TH in the vertical direction. A partial region of the first bonding portion 501 may be vertically overlapped with the through-hole TH. Further, a partial region of the second bonding portion 502 may be vertically overlapped with the through-hole TH. Accordingly, the partial region of the first bonding portion 501 may be exposed by the through-hole TH. Further, the partial region of the second bonding portion 502 may be exposed by the through-hole TH.

Outer surfaces of the first and second bonding portions 501 and 502 may be vertically spaced apart from the through-hole TH. Further, the outer surfaces of the first and second bonding portions 501 and 502 may be spaced apart from the through-hole TH in a horizontal direction. The outer surfaces of the first and second bonding portions 501 and 502 may not be overlapped vertically and/or horizontally with the upper region of the through-hole TH. Here, the vertical direction may be a direction toward the upper surface from the lower surface of the body 100, and the horizontal direction may refer to a direction perpendicular to the vertical direction.

The first bonding portion 501 and the second bonding portion 502 may have at least one of a circular shape, an elliptical shape, a polygonal shape, and an atypical shape having a straight line and a curved line in a top view shape viewed from a plane. In the embodiment, the first and second bonding portions 501 and 502 have been described to have a quadrangular shape, respectively, but the embodiment is not limited thereto, and the bonding portions 501 and 502 may have one shape selected from the above-described shapes.

Each of the first and second bonding portions 501 and 502 may have lengths in the first direction and the second direction. For example, the lengths of the first and second bonding portions 501 and 502 in the first direction may be shorter than that of the light-emitting device 500 in the first direction. Further, the lengths of the first and second bonding portions 501 and 502 in the second direction may be shorter than that of the light-emitting device 500 in the first direction. Further, the length of each of the first and second bonding portions 501 and 502 in the first direction may be longer than that of the through-hole TH in the first direction. Further, the length of each of the first and second bonding portions 501 and 502 in the second direction may be longer than that of the through-hole TH in the second direction.

Accordingly, the light-emitting device 500 may be disposed on the through-hole TH without being inserted into the through-hole TH. Further, the first and second bonding portions 501 and 502 may be disposed on the first body 110 without being inserted into the through-hole TH. The rear surface of each of the first and second bonding portions 501 and 502 may be in contact with the upper surface of the first body 110. Therefore, the light-emitting device 500 may be disposed to be spaced apart from the first body 110. Specifically, the rear surface of the light-emitting device 500 may be spaced apart from the upper surface of the first body 110, and the rear surface of the light-emitting device 500 may be located above the upper surface of the first body 110 in the vertical direction. A predetermined gap may be formed between the rear surface of the light-emitting device 500 and the upper surface of the first body 110. At this time, a height of the gap may correspond to heights of the first and second bonding portions 501 and 502 in the vertical direction.

The light-emitting device 500 may be disposed to be spaced apart from the inner surfaces IS1, IS2, IS3, and IS4 of the second body 130. For example, a minimum distance between the light-emitting device 500 and the inner surfaces IS1, IS2, IS3, and IS4 may be about 50 μm or more. Specifically, the minimum distance may be about 50 μm to about 200 μm. When the distance between the light-emitting device 500 and the inner surfaces IS1, IS2, IS3, and IS4 satisfies the above-described range, a light loss may be reduced and light efficiency may be improved.

A first resin 210 may be disposed between the light-emitting device 500 and the body 100. The first resin 210 may be disposed between the light-emitting device 500, the first body 110, and the second body 130. The first resin 210 may be disposed between the upper surface of the body 100 and the rear surface of the light-emitting device 500. Further, the first resin 210 may be disposed on the upper surface of the first body 110 exposed by the cavity 150.

The first resin 210 may include an adhesive material and/or a reflective material. For example, the first resin 210 may include at least one of an epoxy-based material, a silicone-based material, and a hybrid material containing the epoxy-based material and the silicone-based material. Further, when the first resin 210 includes a reflective function, the adhesive may contain white silicone.

The first resin 210 may be adhered to the light-emitting device 500 and the body 100. The first resin 210 may be disposed between the first bonding portion 501 and the second bonding portion 502 of the light-emitting device 500. The first resin 210 may be in contact with the first bonding portion 501 and the second bonding portion 502. For example, the first resin 210 may be in direct contact with the outer surfaces of the first bonding portion 501 and the second bonding portion 502. Further, the first resin 210 may be in direct contact with a part of a side surface of the light-emitting device 500.

The first resin 210 may be adhered to the rear surface of the light-emitting device 500, the upper surface of the first body 110, and an upper surface region of the second body 130. Further, the first resin 210 may also be adhered to a partial region of the side surface of the light-emitting device 500. Accordingly, the first resin 210 may enhance adhesive force and holding force of a lower portion of the light-emitting device 500. Further, when the first resin 210 is in a process of bonding to the first and second bonding portions 501 and 502 of the light-emitting device 500, or is boded on a circuit board, it is possible to prevent the light-emitting device 500 from being tilted by a conductive layer. In addition, the first resin 210 may be formed of a reflective resin material so as to diffuse light and to improve reflection efficiency.

The body 100 may include a first recess R1. Specifically, the first body 110 may include the first recess R1. At least one of the first recesses R1 may be disposed on the upper surface of the first body 110. The first recess R1 may have a concave shape toward the rear surface from the upper surface of the first body 110. A width and depth of the first recess R1 may be several tens of micrometers, respectively. For example, the width and depth of the first recess R1 may be about 20 μm to about 40 μm. When the width and depth of the first recess are outside the above-described range, the reliability of the first body 110 may be deteriorated. Therefore, it is desirable that the width and depth of the first recess satisfy the above-described range so that the first body 110 may maintain a stable strength.

The first recess R1 may be disposed to be spaced apart from the through-hole TH. The first recess R1 may be disposed at a position corresponding to the light-emitting device 500. Specifically, a part of the first recess R1 may be disposed to be overlapped with the light-emitting device 500.

The first recess R1 may function as an align key. In a process of attaching the light-emitting device 500 to the body 100, the first recess R1 may provide an alignment position of the light-emitting device 500.

In addition, the first resin 210 may be provided to the first recess R1. After the first resin 210 is provided to the first recess R1, it is possible to easily control a disposition position and appropriate supply amount of the first resin 210 by adhering the light-emitting device 500 to the body 100. That is, the first recess R1 may provide an appropriate space under the light-emitting device 500 in which a kind of underfill process may be performed. The first recess R1 may provide a space in which the first resin 210 may be sufficiently supplied between the rear surface of the light-emitting device 500 and the upper surfaces of the first and second bodies 110 and 130.

The light-emitting device package 1000 may include the metal portion 300. The metal portion 300 may be disposed on the rear surface of the body 100. Specifically, the metal portion 300 may be in direct contact with the rear surface of the first body 110. The metal portion 300 may be disposed on a partial region on the rear surface of the first body 110. In addition, the metal portion 300 may be further disposed in the through-hole TH of the body 100. For example, the metal portion 300 may be disposed on a partial region of the through-hole TH. Specifically, the metal portion 300 may be extended from the rear surface of the body 100 to the inner surface of the through-hole TH. The metal portion 300 may be in direct contact with the inner surface of the through-hole TH. Further, the metal portion 300 may be extended to the upper region of the through-hole TH to be in direct contact with the first and second bonding portions 501 and 502 disposed on the rear surface of the light-emitting device 500.

The metal portion 300 may include a metal. For example, the metal portion 300 may be selected from copper (Cu), titanium (Ti), nickel (Ni), gold (Au), chromium (Cr), tantalum (Ta), platinum (Pt), tin (Sn), and Silver (Ag), and may be formed in a single layer or multiple layers. Specifically, when the metal portion 300 is formed in the multiple layers, it may include a first layer in contact with the body 100 and a second layer disposed under the first layer. At this time, the first layer may contain at least one of Ti, Cr, Ta, and Pt, and the second layer may contain at least one of Au, Ag, and Cu.

A thickness h1 of the metal portion 300 may be smaller than that of the first body 110. Here, the thickness h1 of the metal portion 300 may refer to a thickness of the metal portion 300 disposed on a rear surface of the first body 110 in the third direction, and the thickness of the first body 110 may refer to a thickness between the upper surface and the lower surface of the first body 110. The thickness h1 of the metal portion 300 may be about 1/30 or less of the thickness of the first body 110. Specifically, the thickness h1 of the metal portion 300 may be about 1/30 to about 1/100 of the thickness of the first body 110.

Further, the thickness h1 of the metal portion 300 may be 1/3 or less of a width of the through-hole TH in the first direction. Specifically, the thickness h1 of the metal portion 300 may be about 5 μm or less. Specifically, the thickness h1 of the metal portion 300 may be about 2 μm to about 5 μm. When the thickness h1 of the metal portion 300 satisfies the above-described range, the metal portion 300 may be formed thinly and uniformly on a surface of the body 100 and in the through-hole TH. In addition, it is possible to secure a region in which the conductive portions 771 and 772 for connecting the light-emitting device 500 and a circuit board 710 to be described later may be disposed. Further, when the thickness h1 of the metal portion 300 satisfies the above-described range, the metal portion 300 may effectively serve as a path capable of discharging heat released from the light-emitting device 500, and may improve electrical conduction characteristics.

That is, in the embodiment, the metal portion 300 may be formed on the surface of the body 100 through a deposition process or a plating process, and the metal portion 300 may be formed in a thin thickness. In addition, in the light-emitting device package 1000 according to the embodiment, since a lead frame and the body 100 are not injected integrally, it is possible to solve a problem due to a difference in a thermal expansion coefficient between two materials when the lead frame disposed under the light-emitting device 500 is coupled to the body 100. Further, since the deposition process or the plating process is performed on a surface of the through-hole TH by using a metal, the metal portion 300 may be formed thinly and uniformly on the inner surface of the through-hole TH. Accordingly, a contact area between the bonding portions 501 and 502 and the conductive portions 771 and 772 may be expanded, and thus electrical characteristics of the light-emitting device package 1000 may be improved.

The metal portion 300 may include a plurality of metal portions that are spaced apart from each other. For example, the metal portion 300 may include a first metal portion 310 and a second metal portion 320 that are spaced apart from each other. The first metal portion 310 and the second metal portion 320 may be separated physically. For example, the first metal portion 310 and the second metal portion 320 may be disposed so as not to be overlapped in the first direction, the second direction, or the third direction. Therefore, the first and second metal portions 310 and 320 may be disposed to be spaced apart from each other on the rear surface of the body 100 and in the through-hole TH.

The first metal portion 310 and the second metal portion 320 may contain materials corresponding to each other. For example, the first metal portion 310 and the second metal portion 320 may contain the same material selected from the above-described materials. For example, the first metal portion 310 and the second metal portion 320 may contain one material and the same materials as each other selected from copper (Cu), titanium (Ti), nickel (Ni), gold (Au), chromium (Cr), tantalum (Ta), platinum (Pt), tin (Sn), and silver (Ag). Alternatively, the first metal portion 310 and the second metal portion 320 may include different materials selected from the above-described materials.

The first metal portion 310 may be disposed on the rear surface of the first body 110. The first metal portion 310 may be disposed extending in the first direction and/or the second direction on a partial region of the rear surface of the first body 110. The first metal portion 310 may be in direct contact with the rear surface of the first body 110. The first metal portion 310 may be disposed around the through-hole TH. The first metal portion 310 may be electrically connected to the first bonding portion 501.

The first metal portion 310 may have a '⊏' shape when viewing it in a plane. Specifically, when the through-hole TH has a quadrangular shape as shown in FIG. 4, the first metal portion 310 may have the '⊏' shape.

An area of a lower surface of the first metal portion 310 may be about ½ or less of an area of the rear surface of the first body 110. Specifically, the area of the lower surface of the first metal portion 310 may be about ½ to about ⅕ of the area of the rear surface of the first body 110. Here, the area of the rear surface of the first body 110 may refer to an area of a region excluding the area of the through-hole TH among the area of the rear surface of the first body 110.

The first metal portion 310 may include a first extension portion 315. Specifically, the first metal portion 310 may include the first extension portion that is disposed in the through-hole TH. The first extension portion 315 may be connected to the first metal portion 310 to extend to the through-hole TH. For example, one end of the first extension portion 315 may be connected to one end of the first metal portion 310 to extend to the through-hole TH.

The first extension portion 315 may include metal. For example, the first extension portion 315 may be selected from copper (Cu), titanium (Ti), nickel (Ni), gold (Au), chromium (Cr), tantalum (Ta), platinum (Pt), tin (Sn), and silver (Ag), and may be formed in a single layer or multiple layers. The first extension portion 315 may contain a material corresponding to the first metal portion 310. In addition, the first extension portion 315 may be integrally formed with the first metal portion 310. That is, the first metal portion 310 may be disposed around the first extension portion 315, and at this time, the first extension portion 315 may be integrally formed.

The first extension portion 315 may be in direct contact with the inner surface of the through-hole TH. For example, the first extension portion 315 may be in direct contact with three side surfaces of the four side surfaces of the through-hole TH. Specifically, the first extension portion 315 may be disposed on the entire region of the first inner surface, a partial region of the third inner surface, and a partial region of the fourth inner surface. In addition, the first extension portion 315 may face the first bonding portion 501. The first extension portion 315 may be disposed in a region corresponding to the first bonding portion 501 in the vertical direction. The first extension portion 315 may be electrically connected to the first bonding portion 501. The first extension portion 315 may be contacted and connected to the first bonding portion 501. Specifically, the other end of the first extension portion 315 may be in direct contact with the rear surface of the first bonding portion 501. The other end of the first extension portion 315 may be located on the same line as the upper surface of the first body 110 and the rear surface of the first bonding portion 501. Accordingly, a height of the first extension portion 315 in the vertical direction (a height in the third direction) may correspond to the thickness of the first body 110.

The first extension portion 315 may have a uniform distance in the through-hole TH. For example, a distance between the first extension portions 315 facing each other in the second direction may be constant among the first extension portions 315. Specifically, a distance between the first extension portions 315 disposed on the partial regions of the third inner surface and the fourth inner surface of the through-hole TH and facing each other in the second direction may be uniform in the through-hole TH.

The first extension portion 315 may be disposed on the inner surface of the through-hole TH. An area of the first extension portion 315 may be less than about ½ of the entire area of the inner surface of the through-hole TH. When the area of the first extension portion 315 is about ½ or more, the first extension portion 315 may be in contact with and electrically connected to a second extension portion 325 to be described later. Accordingly, it is desirable that the area of the first extension portion 315 disposed in the through-hole TH satisfies the above-described range.

The first extension portion 315 may have a shape corresponding to the through-hole TH. Specifically, when the through-hole TH has a quadrangular shape as shown in FIG. 4 when viewing it in a plane, the first extension portion 315 may have a shape corresponding to the through-hole TH. For example, the first extension portion 315 may have a '⊏' shape when viewing it in a plane.

The first extension portion 315 may be perpendicular to the first metal portion. Specifically, the inner surface of the through-hole TH may be perpendicular to the rear surface of the body 100. Accordingly, an inclination between the first extension portion 315 and the first metal portion 310, which are disposed on the inner surface of the through-hole TH and the rear surface of the body 100 respectively, may be vertical.

A thickness of the first extension portion 315 may correspond to a thickness of the first metal portion 310. For example, the thicknesses of the first extension portion 315 and the first metal portion 310 may be about 5 μm or less. Specifically, the thicknesses of the first extension portion 315 and the first metal portion 310 may be about 2 μm to about 5 μm. When the thicknesses of the first extension portion 315 and the first metal portion 310 are thinner than the above-described range, they may not serve as a heat dissipation path, and when they are thicker than the above-described range, it may be difficult to secure a region in which the conductive portions 771 and 772 may be disposed in the through-hole TH. Therefore, it is desirable that the thicknesses of the first extension portion 315 and the first metal portion 310 satisfy the above-described ranges.

The second metal portion 320 may be disposed on the rear surface of the first body 110. The second metal portion 320 may be disposed extending in the first direction and/or the second direction on another partial region of the rear surface of the first body 110. The second metal portion 320 may be in direct contact with the rear surface of the first body 110. The second metal portion may be disposed around the through-hole TH. The second metal portion 320 may be electrically connected to the second bonding portion 502.

The second metal portion 320 may be disposed to be spaced apart from the first metal portion 310. Specifically, the second metal portion 320 may be disposed to be spaced apart from the first metal portion 310 in the first direction. In addition, the second metal portion 320 may have a shape corresponding to the first metal portion 310. For example, the second metal portion 320 may have a '⊏' shape when viewing it in a plane. Specifically, when the through-hole TH has a quadrangular shape as shown in FIG. 4, the second metal portion 320 may have a '⊏' shape. The first extension portion 315 and the second extension portion 325 may have shapes symmetrical with respect to the second direction (y-axis).

An area of a lower surface of the second metal portion 320 may be about ½ or less of an area of the rear surface of the first body 110. Specifically, the area of the lower surface of the second metal portion 320 may be about ½ to about ⅕ of the area of the rear surface of the first body 110. Here, the area of the rear surface of the first body 110 may refer to an area of a region excluding the area of the through-hole TH among the area of the rear surface of the first body 110. The area of the lower surface of the second metal portion 320 may correspond to the area of the lower surface of the first metal portion 310. Accordingly, a sum of the areas of the lower surfaces of the first metal portion 310 and the second metal portion 320, may be smaller than the area of the rear surface of the first body 110.

The second metal portion 320 may include the second extension portion 325. Specifically, the second metal portion 320 may include the second extension portion 325 that is disposed in the through-hole TH. The second extension portion 325 may be connected to the second metal portion 320 to extend to the through-hole TH. For example, one end of the second extension portion 325 may be connected to one end of the second metal portion 320 to extend to the through-hole TH.

The second extension portion 325 may include metal. For example, the second extension portion 325 may be selected from copper (Cu), titanium (Ti), nickel (Ni), gold (Au), chromium (Cr), tantalum (Ta), platinum (Pt), tin (Sn), and silver (Ag), and may be formed in a single layer or multiple layers. The second extension portion 325 may contain a material corresponding to the second metal portion 320. In addition, the second extension portion 325 may be integrally formed with the second metal portion 320. That is, the second metal portion 320 may be disposed around the second extension portion 325, and at this time, the second extension portion 325 may be integrally formed. Further, the second extension portion 325 may contain a material corresponding to the first extension portion 315.

The second extension portion 325 may be in direct contact with the inner surface of the through-hole TH. For example, the second extension portion 325 may be in direct contact with three side surfaces of the four side surfaces of the through-hole TH. Specifically, the second extension portion 325 may be disposed on the entire region of the second inner surface, another partial region of the third inner surface and another partial region of the fourth inner surface. In addition, the second extension portion 325 may face the second bonding portion 502. The second extension portion 325 may be disposed in a region corresponding to the second bonding portion 502 in the vertical direction. The second extension portion 325 may be electrically connected to the second bonding portion 502. The second extension portion 325 may be contacted and connected to the second bonding portion 502. Specifically, the other end of the second extension portion 325 may be in direct contact with the rear surface of the second bonding portion 502. The other end of the second extension portion 325 may be located on the same line as the upper surface of the first body 110 and the rear surface of the second bonding portion 502. Accordingly, a height of the second extension portion 325 in the vertical direction (a height in the third direction) may correspond to the thickness of the first body 110. Further, the height of the second extension portion 325 in the vertical direction may correspond to the height of the first extension portion 315 in the vertical direction.

The second extension portion 325 may be disposed to be spaced apart from the first extension portion 315. As the second extension portion 325 is disposed on other regions of the third and fourth inner surfaces in which the first extension portion 315 is not disposed, the second extension portion 325 may be disposed to be spaced apart from the first extension portion 315. The second extension portion 325 may be disposed to be spaced apart from the first extension portion 315 in the through-hole TH in the first direction. The second extension portion 325 may be disposed facing the first extension portion 315 in the through-hole TH.

The second extension portion 325 may have a uniform distance in the through-hole TH. For example, a distance between the second extension portions 325 facing each other in the second direction may be constant among the second extension portions 325. Specifically, a distance between the second extension portion 325 disposed on the partial regions of the third inner surface and the fourth inner surface of the through-hole TH and facing each other in the second direction may be uniform in the through-hole TH.

The second extension portion 325 may be disposed on the inner surface of the through-hole TH. An area of the second extension portion 325 may be less than about ½ of the entire area of the inner surface of the through-hole TH. When the area of the second extension portion 325 is about ½ or more, the second extension portion 325 may be in contact with and electrically connected to the first extension portion 315. Accordingly, it is desirable that the area of the second extension portion 325 disposed in the through-hole TH satisfies the above-described range. Further, the area of the second extension portion 325 may correspond to the area of the first extension portion 315. Accordingly, a sum of the areas of the first extension portion 315 and the second extension portion 325 may be smaller than the entire area of the inner surface of the through-hole TH.

The second extension portion 325 may have a shape corresponding to the through-hole TH. Specifically, when the through-hole TH has a quadrangular shape as shown in FIG. 4 when viewing it in a plane, the second extension portion 325 may have a shape corresponding to the through-hole TH. For example, the second extension portion 325 may have a '⊏' shape when viewing it in a plane. Further, the second extension portion 325 may have a shape corresponding to the first extension portion 315. Specifically, the first extension portion 315 and the second extension portion 325 may have shapes symmetrical with respect to the second direction (y-axis).

The second extension portion 325 may be perpendicular to the second metal 320. Specifically, the inner surface of the through-hole TH may be perpendicular to the rear surface of the body 100. Accordingly, an inclination between the second extension portion 325 and the second metal portion 320, which are disposed on the inner side surface of the through-hole TH and the rear surface of the body 100 respectively, may be vertical.

A thickness of the second extension portion 325 may correspond to a thickness of the second metal portion 320. For example, the thicknesses of the second extension portion 325 and the second metal portion 320 may be about 5 μm or less. Specifically, the thicknesses of the second extension portion 325 and the second metal portion 320 may be about 2 μm to about 5 μm. When the thicknesses of the second extension portion 325 and the second metal portion 320 are thinner than the above-described range, they may not serve as a heat dissipation path, and when they are thicker than the above-described range, it may be difficult to secure a region in which the conductive portions 771 and 772 may be disposed in the through-hole TH. Therefore, it is desirable that the thicknesses of the second extension portion 325 and the second metal portion 320 satisfy above-described ranges.

The thicknesses of the second metal portion 320 and the second extension portion 325 may correspond to the thicknesses of the first metal portion 310 and the first extension portion 315. Accordingly, the rear surface of the first metal portion 310 may be disposed on the same plane as the rear surface of the second metal portion 320.

The first extension portion 315 and the second extension portion 325 may be parallel. For example, one surface of the first extension portion 315 and one surface of the second extension portion 325 may be parallel to each other. In addition, a distance between the first extension portion 315 and the second extension portion 325 may correspond to each other. For example, the distance between the first extension portion 315 and the second extension portion 325 facing each other in the first direction may be constant. Specifically, the distance between the first extension portion 315 and the second extension portion 325 facing in the first direction may have a uniform distance in the through-hole TH.

A value of the maximum distance between the first extension portion 315 and the second extension portion 325 may be larger than a distance between the first bonding portion 501 and the second bonding portion 502. Further, the first extension portion 315 and the second extension portion 325 may have a first distance d1 defined as a value of the shortest distance. At this time, the first distance d1 may be smaller than the shortest distance between the first bonding portion 501 and the second bonding portion 502. Accordingly, the heat released from the light-emitting device 500 may be effectively discharged via the first and second metal portions 310 and 320.

Further, the first metal portion 310 and the second metal portion 320 may be disposed on the same plane. The first metal portion 310 and the second metal portion 320 may have a second distance d2 defined as a value of the shortest distance. At this time, the first distance d1 and the second distance d2 may correspond to each other.

The body 100 may further include a second recess R2. Referring to FIGS. 4 and 7, the second recess R2 may be formed on the rear surface of the first body 110. The second recess R2 may be disposed between the first metal portion 310 and the second metal portion 320.

The second recess R2 may have a concave shape toward the upper surface from the rear surface of the first body 110. Further, the second recess R2 may include a curved surface or an angular surface. The surface of the second recess R2 may include a rough surface. The second recess R2 is a region from which the first metal portion 310 and the second metal portion 320 have been removed, and may electrically separate the first metal portion 310 and the second metal portion 320.

A length of the second recess R2 in the first direction may correspond to the first distance d1. In addition, the length of the second recess R2 in the first direction may correspond to the second distance d2. Further, the second recess R2 may have a form extending in the second direction. The second recess R2 may have a length in the second direction. In addition, a sum of lengths of the second recess R2 and the through-hole TH in the second direction may correspond to the length of the first metal portion 310 in the second direction. Further, the sum of lengths of the second recess R2 and the through-hole TH in the second direction may correspond to the length of the second metal portion 320 in the second direction.

An example in which a second resin 220 is further disposed in the light-emitting device package 1000 of FIG. 2 will be described with reference to FIG. 8. Referring to FIG. 8, the light-emitting device package 1000 according to an embodiment may further include the second resin 220. The second resin 220 may be disposed on the rear surface of the light-emitting device 500. The second resin 220 may be disposed between the first bonding portion 501 and the second bonding portion 502. The second resin 220 may be disposed on a region corresponding to the through-hole TH.

The second resin 220 may prevent an electrical short-circuit between the first bonding portion 501 and the second bonding portion 502. The second resin 220 may include an insulating material. For example, the second resin 220 may include at least one of an epoxy-based material, a silicone-based material, and a hybrid material containing the epoxy-based material and the silicone-based material.

In addition, the second resin 220 may reflect light emitted from the light-emitting device 500. When the second resin 220 includes a reflective function, the second resin 220 may contain white silicone. When the second resin 220 includes the reflective function, the second resin 220 may be formed of a material containing $TiO_2$, $SiO_2$, etc. The second resin 220 may be referred to as an adhesive.

An upper surface of the second resin 220 may be in contact with a rear surface of the light-emitting structure 520. In addition, one side surface of the second resin 220 may be in contact with a side surface of the first bonding portion 501, and the other side surface of the second resin 220 may be in contact with a side surface of the second bonding portion 502.

A rear surface of the second resin 220 may be disposed below the rear surfaces of the first bonding portion 501 and the second bonding portion 502 in the vertical direction. Accordingly, a partial region of the second resin 220 may be disposed to be in contact with a lower surface of the first bonding portion 501 and a lower surface of the second bonding portion 502.

The rear surface of the second resin 220 may be positioned below the upper surface of the first body 110 in the vertical direction. Accordingly, the second resin 220 may be disposed in the through-hole TH. When viewed upwardly from the lower portion of the light-emitting device 500, the through-hole TH may be provided around the second resin 220.

The second resin 220 may be disposed to be spaced apart from the first extension portion 315 and the second extension portion 325. That is, the second resin 220 may be disposed between the first bonding portion 501 and the second bonding portion 502, and may serve to prevent the bonding portions 501 and 502 from being connected to each other by the conductive portions 771 and 772 while providing the conductive portions 771 and 772 later. In addition, the second resin 220 may provide a path through which the conductive portions 771 and 772 may be connected to the first and second bonding portions 501 and 502 via the first and second extension portions 315 and 325. The second resin 220 may be provided integrally with the light-emitting device 500, or may be provided as a separate component.

The light-emitting device package 1000 according to the embodiment may further include a molding portion 400. The molding portion 400 may be provided on the body 100 and the light-emitting device 500. The molding portion 400 may be disposed in the cavity 150 provided by the second body 130. The molding portion 400 may be disposed surrounding the light-emitting device 500.

The molding portion 400 may include an insulating material. In addition, the molding portion 400 may include a wavelength converting means configured to receive light emitted from the light-emitting device 500 and provide wavelength-converted light. For example, the molding portion 400 may include at least one selected from a group consisting of a phosphor, a quantum dot, and the like. The light-emitting device 500 may emit yellow, blue, green, red, white, infrared, and ultraviolet light. The phosphor or quantum dot may emit blue, green, and red light. The molding portion 400 may not be formed.

The phosphor disposed inside or below the molding portion 400 may include a phosphor of a fluoride compound, for example, at least one of an MGF-based phosphor, a KSF-based phosphor, and a KTF-based phosphor. The phosphor may emit light having different peak wavelengths, and may emit light emitted from the light-emitting device at different peak wavelengths of yellow and red or different reds. One of the phosphors may include a red phosphor. The red phosphor may have a wavelength range from 610 nm to 650 nm, and the wavelength may have a full width at half maximum of less than 10 nm. The red phosphor may include a fluoride-based phosphor. The fluoride-based phosphor may contain at least one of KSF-based red $K_2SiF_6:Mn^{4+}$, $K_2TiF_6$: $Mn^{4+}$, $NaYF_4:Mn^{4+}$, $NaGdF_4:Mn^{4+}$, and $K_3SiF_7:Mn^{4+}$. The KSF-based phosphor may have, for example, an empirical formula of $KaSi_{1-c}Fb:Mn^{4+}{}_c$, where the a satisfies 1≤a≤2.5, the b satisfies 5≤b≤6.5, and the c satisfies 0.001≤c≤0.1. Further, the fluoride-based red phosphor may be coated with a fluoride containing no Mn respectively, or may further contain an organic material coating on a surface of the phosphor or a surface of the fluoride coating containing no Mn in order to improve reliability at high temperature and high humidity. In case of the fluoride-based red phosphor as described above, unlike other phosphors, it may realize a narrow full width at half maximum of 10 nm or less, and thus may be utilized in a high-resolution device.

The phosphor composition according to the embodiment should basically conform to stoichiometry, and each element may be replaced with another element in each group on the periodic table. For example, Sr may be replaced with Ba, Ca, Mg, etc. of the alkaline earth (II) group, and Y may be replaced with Tb, Lu, Sc, Gd, etc. of the lanthanum series. In addition, Eu or the like as an activator may be replaced with Ce, Tb, Pr, Er, Yb, etc. depending on a desired energy level, and the activator alone, a sub-activator to modify properties, or the like may be applied additionally.

The quantum dot phosphor may contain the Group II-VI or Group III-V compound semiconductors, and may emit red light. The quantum dot may be, for example, ZnS, ZnSe, ZnTe, CdSe, CdTe, GaN, GaP, GaAs, GaSb, InP, InAs, InAsb, AlS, AlP, AlAs, PbS, PbSe, Ge, Si, CuInS2, CuInS2, etc., and a combination thereof. When the light-emitting device package 1000 according to the embodiment includes a light-emitting device that emits ultraviolet rays (UV), the molding portion 400 may be omitted.

A modified example of the light-emitting device package according to FIGS. 2 to 8 will be described by using FIGS. 9 to 15. In description of the modified example, description of a configuration the same as or similar to that of the light-emitting device package described above will be omitted, and the same drawing reference numerals will be designated to the same or similar configurations.

FIG. 9 is a plan view showing a modified example of the light-emitting device package of FIG. 2, FIG. 10 is a view showing a plan view of a body of the light-emitting device package of FIG. 9, and FIG. 11 is a view showing a rear view of the body of the light-emitting device package of FIG. 9. In addition, FIG. 12 is a rear view of the light-emitting device package of FIG. 9, FIG. 13 is a cross-sectional view taken along line D-D' of the light-emitting device package of FIG. 9, FIG. 14 is a cross-sectional view taken along line F-F' of the light-emitting device package of FIG. 9, and FIG. 15 is a cross-sectional view showing a modified example of the light-emitting device package of FIG. 9.

Referring to FIGS. 9 to 15, the body 100 may include a through-hole TH. Specifically, the first body 110 may include a through-hole TH. The through-hole TH may be a hole passing through the upper surface and the lower surface of the first body 110. A depth of the through-hole TH may correspond to a height of the first body 110.

The through-hole TH may be provided at a depth at which the first body 110 may maintain stable strength. For example, the depth of the through-hole TH may be about 400 µm or less. Specifically, the depth of the through-hole TH may be about 80 µm to about 400 µm. More specifically, the depth of the through-hole TH may be about 100 µm to about 300 µm.

The through-hole TH may have a polygonal shape. For example, when viewing it in a plane, the through-hole TH may have a quadrangular shape. However, the embodiment is not limited thereto, and the through-hole TH may have various shapes. For example, the through-hole TH may have at least one of a polygonal shape, a circular shape, an elliptical shape, and an atypical shape having a straight line and a curved line. In addition, a shape of the upper region of the through-hole TH may be the same as or different from a shape of the lower region of the through-hole TH.

A width of the through-hole TH may be changed. For example, a width of an upper region of the through-hole TH may be different from a width of a lower region. Specifically, the width of the through-hole TH may increase toward the lower region from the upper region.

Specifically, an inner surface of the through-hole TH may be an inclined surface inclined with respect to the upper surface and/or the rear surface of the body 100. For example, the inner surface of the through-hole TH may have an acute angle with respect to the upper surface of the body 100, and may have an alternate angle with respect to the rear surface of the body 100. In addition, the inclined surface may be a line, and may be a curve having a curvature.

The inner surface of the through-hole TH may include a plurality of inclined surfaces HS1, HS2, HS3, and HS4. For example, the through-hole TH may include a first inclined surface HS1 and a second inclined surface HS2 facing each other in a first direction, and a third inclined surface HS3 and a fourth inclined surface HS4 facing each other in a second direction. The third and fourth inclined surfaces HS3 and HS4 may be surfaces connecting the first and second inclined surfaces HS1 and HS2.

The first inclined surface HS1 may have a first inclination angle θ1 with respect to the rear surface of the first body 110. The second inclined surface HS2 may have a second inclination angle θ2 with respect to the rear surface of the first body 110. The third inclined surface HS3 may have a third inclination angle θ3 with respect to the rear surface of the first body 110. In addition, the fourth inclined surface HS4 may have a fourth inclination angle θ4 with respect to the rear surface of the first body 110. The first to fourth inclination angles θ1, θ2, θ3, and θ4 may be alternate angles. Accordingly, a distance between the first inclined surface HS1 and the second inclined surface HS2 may be changed. For example, the distance between the first inclined surface HS1 and the second inclined surface HS2 may increase toward the lower region from the upper region of the through-hole TH. In addition, a distance between the third inclined surface HS3 and the fourth inclined surface HS4 may be changed. For example, the distance between the third inclined surface HS3 and the fourth inclined surface HS4 may increase toward the lower region from the upper region of the through-hole TH.

Alternatively, although not shown in the drawing, the third and fourth inclined surfaces HS3 and HS4 may be perpendicular to the rear surface of the first body 110. That is, the third and fourth inclination angles θ3 and θ4 may be about 90 degrees. Accordingly, the distance between the third inclined surface HS3 and the fourth inclined surface HS4 may be constant. In this case, the interval between the first inclined surface HS1 and the second inclined surface HS2 may be changed, and the interval between the third inclined surface HS3 and the fourth inclined surface HS4 may be constant.

An area of the upper region of the through-hole TH may be smaller than an area of the lower region. In addition, the area of the upper region of the through-hole TH may be smaller than an area of the light-emitting device 500. The area of the upper region of the through-hole TH may be about 60% to about 95% of the area of the light-emitting device 500. Specifically, the area of the upper region of the through-hole TH may be about 70% to about 95% of the area of the light-emitting device 500. When the area of the upper region of the through-hole TH is less than about 60% of the area of the light-emitting device 500, the conductive portions 771 and 772 to be described later may not be smoothly supplied into the through-hole TH. In addition, when the area exceeds about 95%, the light-emitting device 500 may be disposed to be partially inserted into the through-hole TH, so that the light efficiency may be lowered. Therefore, it is preferable that the area of the upper region of the through-hole TH satisfies the above-described range.

In addition, the area of the lower region of the through-hole TH may be smaller than the area of the light-emitting device 500. Alternatively, the area of the lower region of the through-hole TH may be greater than or equal to the area of the light-emitting device 500. Accordingly, the conductive portions 771 and 772 may be effectively disposed in the through-hole TH.

The light-emitting device 500 may be disposed in the cavity 150. Specifically, the light-emitting device 500 may be disposed on the upper surface of the first body 110 exposed by the cavity 150. The light-emitting device 500 may be disposed on the through-hole TH. The light-emitting device 500 may be disposed at a position corresponding to the through-hole TH in the vertical direction. The light-emitting device 500 may have lengths in the first direction and the second direction. For example, the length of the light-emitting device 500 in the first direction may be longer than that of the through-hole TH in the first direction. Further, the length of the light-emitting device 500 in the second direction may be longer than that of the through-hole TH in the second direction.

The first and second bonding portions 501 and 502 may be disposed on the through-hole TH. The first and second bonding portions 501 and 502 may be disposed at positions corresponding to the through-hole TH in the vertical direction. A partial region of the first bonding portion 501 may be vertically overlapped with the through-hole TH. Further, a partial region of the second bonding portion 502 may be vertically overlapped with the through-hole TH. Accordingly, the partial region of the first bonding portion 501 may be exposed by the through-hole TH. Further, the partial region of the second bonding portion 502 may be exposed by the through-hole TH.

Each of the first and second bonding portions 501 and 502 may have lengths in the first direction and the second direction. The length of each of the first and second bonding portions 501 and 502 in the first direction may be longer than a length of the upper region of the through-hole TH in the first direction. Further, the length of each of the first and second bonding portions 501 and 502 in the second direction may be longer than a length of the upper region of the through-hole TH in the second direction. Accordingly, the light-emitting device 500 may be disposed on the through-hole TH without being inserted into the through-hole TH.

Further, the first and second bonding portions 501 and 502 may be disposed on the first body 110 without being inserted into the through-hole TH.

The light-emitting device package 1000 may include the metal portion 300. The metal portion 300 may be disposed on the rear surface of the body 100. Specifically, the metal portion 300 may be in direct contact with the rear surface of the first body 110. The metal portion 300 may be disposed on a partial region on the rear surface of the first body 110. In addition, the metal portion 300 may be further disposed in the through-hole TH of the body 100. For example, the metal portion 300 may be disposed on a partial region of the through-hole TH. Specifically, the metal portion 300 may be disposed on the inclined surface of the through-hole TH. The metal portion 300 may be extended from the rear surface of the body 100 to the inner surface of the through-hole TH. The metal portion 300 may be extended to the upper region of the through-hole TH to be in direct contact with the first and second bonding portions 501 and 502 disposed on the rear surface of the light-emitting device 500.

The thickness of the metal portion 300 may be about 5 μm or less. Specifically, the thickness h1 of the metal portion 300 may be about 2 μm to about 5 μm. When the thickness h1 of the metal portion 300 satisfies the above-described range, the metal portion 300 may be formed thinly and uniformly on the surface of the body 100 and the inclined surface of the through-hole TH. In addition, it is possible to secure a region in which the conductive portions 771 and 772 for connecting the light-emitting device 500 and a circuit board 710 to be described later may be disposed. Further, when the thickness h1 of the metal portion 300 satisfies the above-described range, the metal portion 300 may effectively serve as a path capable of discharging heat released from the light-emitting device 500, and may improve electrical conduction characteristics.

The metal portion 300 may include a plurality of metal portions that are spaced apart from each other. For example, the metal portion 300 may include a first metal portion 310 and a second metal portion 320 that are spaced apart from each other. The first metal portion 310 and the second metal portion 320 may be separated physically. For example, the first metal portion 310 and the second metal portion 320 may be disposed so as not to be overlapped in the first direction, the second direction, or the third direction. Therefore, the first and second metal portions 310 and 320 may be disposed to be spaced apart from each other on the rear surface of the body 100 and in the through-hole TH.

The first metal portion 310 and the second metal portion 320 may contain materials corresponding to each other. For example, the first metal portion 310 and the second metal portion 320 may contain the same material selected from the above-described materials. For example, the first metal portion 310 and the second metal portion 320 may contain one material and the same materials as each other selected from copper (Cu), titanium (Ti), nickel (Ni), gold (Au), chromium (Cr), tantalum (Ta), platinum (Pt), tin (Sn), and silver (Ag). Alternatively, the first metal portion 310 and the second metal portion 320 may include different materials selected from the above-described materials.

The first metal portion 310 may be disposed on the rear surface of the first body 110. The first metal portion 310 may be disposed extending in the first direction and/or the second direction on a partial region of the rear surface of the first body 110. The first metal portion 310 may be in direct contact with the rear surface of the first body 110. The first metal portion 310 may be disposed around the through-hole TH. The first metal portion 310 may be electrically connected to the first bonding portion 501.

The first metal portion 310 may have a '⊏' shape when viewing it in a plane. Specifically, when the through-hole TH has a quadrangular shape as shown in FIG. 4, the first metal portion 310 may have the '⊏' shape.

An area of a lower surface of the first metal portion 310 may be about ½ or less of an area of the rear surface of the first body 110. Specifically, the area of the lower surface of the first metal portion 310 may be about ½ to about ⅕ of the area of the rear surface of the first body 110. Here, the area of the rear surface of the first body 110 may refer to an area of a region excluding the area of the through-hole TH among the area of the rear surface of the first body 110.

The first metal portion 310 may include a first extension portion 315. Specifically, the first metal portion 310 may include the first extension portion 315 disposed in the through-hole TH. The first extension portion 315 may be disposed on the inclined surface of the through-hole TH. The first extension portion 315 may be connected to the first metal portion 310 to extend to the through-hole TH. For example, one end of the first extension portion 315 may be connected to one end of the first metal portion 310 to extend to the through-hole TH.

The first extension portion 315 may be in direct contact with the inclined surface of the through-hole TH. For example, the first extension portion 315 may be in direct contact with three side surfaces of the four inclined surfaces HS1, HS2, HS3, and HS4 of the through-hole TH. Specifically, the first extension portion 315 may be disposed on the entire region of the first inclined surface HS1, and may be disposed on a partial region of the third inclined surface HS3 and a partial region of the fourth inclined surface HS4.

The first extension portion 315 may include metal. For example, the first extension portion 315 may be selected from copper (Cu), titanium (Ti), nickel (Ni), gold (Au), chromium (Cr), tantalum (Ta), platinum (Pt), tin (Sn), and silver (Ag), and may be formed in a single layer or multiple layers. The first extension portion 315 may contain a material corresponding to the first metal portion 310. In addition, the first extension portion 315 may be integrally formed with the first metal portion 310. That is, the first metal portion 310 may be disposed around the first extension portion 315, and at this time, the first extension portion 315 may be integrally formed.

The first extension portion 315 may be in contact with the inner surface of the through-hole TH. The first extension portion 315 may face the first bonding portion 501. The first extension portion 315 may be disposed in a region corresponding to the first bonding portion 501 in the vertical direction. The first extension portion 315 may be electrically connected to the first bonding portion 501. The first extension portion 315 may be contacted and connected to the first bonding portion 501. Specifically, the other end of the first extension portion 315 may be in direct contact with the rear surface of the first bonding portion 501. The other end of the first extension portion 315 may be located on the same line as the upper surface of the first body 110 and the rear surface of the first bonding portion 501. Accordingly, a height of the first extension portion 315 in the vertical direction (a height in the third direction) may correspond to the thickness of the first body 110.

A distance of the first extension portion 315 may be changed in the through-hole TH. For example, a distance between the first extension portions 315 facing each other in the second direction among the first extension portions 315 may be changed. Specifically, the distance between the first extension portions 315 disposed on partial regions of the third inclined surface HS3 and the fourth inclined surface HS4 of the through-hole TH may be changed. The distance may increase toward the lower region from the upper region of the through-hole TH. That is, when the distance between the third inclined surface HS3 and the fourth inclined surface HS4 is changed toward the lower region from the upper region of the through-hole TH, the distance may increase toward the lower region from the upper region of the through-hole TH.

The area of the first extension portion 315 may be less than about ½ of the entire area of the inner surface of the through-hole TH. Specifically, the area of the first extension portion 315 may be less than about ½ of a sum of the areas of the first to fourth inclined surfaces HS1, HS2, HS3, and HS4. When the area of the first extension portion 315 is about ½ or more, the first extension portion 315 may be in contact with and electrically connected the second extension portion 325. Accordingly, it is desirable that the area of the first extension portion 315 disposed in the through-hole TH satisfies the above-described range.

The first extension portion 315 may have a shape corresponding to the through-hole TH. Specifically, when the through-hole TH has a quadrangular shape as shown in FIG. 12 when viewing it in a plane, the first extension portion 315 may have a shape corresponding to the through-hole TH. For example, the first extension portion 315 may have a '⊏' shape when viewing it in a plane.

The first extension portion 315 may have an inclination angle with respect to the first metal portion 310. Specifically, the inclined surfaces HS1, HS2, HS3, and HS4 of the through-hole TH have an alternate angle with respect to the rear surface of the body 100, and accordingly, the first extension portion 315 may be disposed to be inclined to the first metal portion 310, and may have an alternate inclination angle.

The thickness of the first extension portion 315 may correspond to a thickness of the first metal portion 310. For example, the thicknesses of the first extension portion 315 and the first metal portion 310 may be about 5 μm or less. Specifically, the thicknesses of the first extension portion 315 and the first metal portion 310 may be about 2 μm to about 5 μm. When the thicknesses of the first extension portion 315 and the first metal portion 310 are thinner than the above-described range, they may not serve as a heat dissipation path, and when they are thicker than the above-described range, it may be difficult to secure a region in which the conductive portions 771 and 772 may be disposed in the through-hole TH. Therefore, it is desirable that the thicknesses of the first extension portion 315 and the first metal portion 310 satisfy the above-described ranges.

The second metal portion 320 may be electrically connected to the second bonding portion 502. The second metal portion 320 may be disposed in at least one of the rear surface of the first body 110 and a partial region of the inner surface of the through-hole TH.

The second metal portion 320 may be disposed on the rear surface of the first body 110. The second metal portion 320 may be disposed extending in the first direction and/or the second direction on another partial region of the rear surface of the first body 110. The second metal portion 320 may be in direct contact with the rear surface of the first body 110. The second metal portion may be disposed around the through-hole TH. The second metal portion 320 may be electrically connected to the second bonding portion 502.

The second metal portion 320 may be disposed to be spaced apart from the first metal portion 310. Specifically, the second metal portion 320 may be disposed to be spaced apart from the first metal portion 310 in the first direction. In addition, the second metal portion 320 may have a shape corresponding to the first metal portion 310. For example, the second metal portion 320 may have a '⊏' shape when viewing it in a plane. Specifically, when the through-hole TH has a quadrangular shape as shown in FIG. 12, the second metal portion 320 may have a '⊏' shape. The first metal portion 310 and the second metal portion 320 may have shapes symmetrical with respect to the second direction (y-axis).

The area of a lower surface of the second metal portion 320 may be about ½ or less of an area of the rear surface of the first body 110. Specifically, the area of the lower surface of the second metal portion 320 may be about ½ to about ⅕ of the area of the rear surface of the first body 110. Here, the area of the rear surface of the first body 110 may refer to an area of a region excluding the area of the through-hole TH among the area of the rear surface of the first body 110. The area of the lower surface of the second metal portion 320 may correspond to the area of the lower surface of the first metal portion 310. Accordingly, the sum of the areas of the lower surfaces of the first metal portion 310 and the second metal portion 320, may be smaller than the area of the rear surface of the first body 110.

The second metal portion 320 may include the second extension portion 325. Specifically, the second metal portion 320 may include the second extension portion 325 that is disposed in the through-hole TH. The second extension portion 325 may be disposed on the inclined surface of the through-hole TH. The second extension portion 325 may be connected to the second metal portion 320 to extend to the through-hole TH. For example, one end of the second extension portion 325 may be connected to one end of the second metal portion 320 to extend to the through-hole TH.

The second extension portion 325 may be in direct contact with the inclined surface of the through-hole TH. The second extension portion 325 may be disposed on an inclined surface on which the first extension portion 315 is not disposed. For example, the second extension portion 325 may be in direct contact with the three side surfaces of the four inclined surfaces HS1, HS2, HS3, and HS4 of the through-hole TH. Specifically, the second extension portion 325 may be disposed on the entire region of the second inclined surface HS2, and may be disposed on another partial region of the third inclined surface HS3 and another partial region of the fourth inclined surface HS4.

The second extension portion 325 may include metal. For example, the second extension portion 325 may be selected from copper (Cu), titanium (Ti), nickel (Ni), gold (Au), chromium (Cr), tantalum (Ta), platinum (Pt), tin (Sn), and silver (Ag), and may be formed in a single layer or multiple layers. The second extension portion 325 may contain a material corresponding to the second metal portion 320. In addition, the second extension portion 325 may be integrally formed with the second metal portion 320. That is, the second metal portion 320 may be disposed around the second extension portion 325, and at this time, the second extension portion 325 may be integrally formed.

The second extension portion 325 may be in direct contact with the inner surface of the through-hole TH. The second extension portion 325 may face the second bonding portion 502. The second extension portion 325 may be disposed in a region corresponding to the second bonding portion 502 in the vertical direction. The second extension portion 325 may be electrically connected to the second bonding portion 502. The second extension portion 325 may be contacted and connected to the second bonding portion 502. Specifically, the other end of the second extension portion 325 may be in direct contact with the rear surface of the second bonding portion 502. The other end of the second extension portion 325 may be located on the same line as the upper surface of the first body 110 and the rear surface of the second bonding portion 502. Accordingly, a height of the second extension portion 325 in the vertical direction (a height in the third direction) may correspond to the thickness of the first body 110. Further, the height of the second extension portion 325 in the vertical direction may correspond to the height of the first extension portion 315 in the vertical direction.

The distance of the second extension portion 325 may be changed in the through-hole TH. For example, a distance between the second extension portions 325 facing each other in the second direction among the second extension portions 325 may be changed. Specifically, the distance between the second extension portions 325 disposed on partial regions of the third inclined surface HS3 and the fourth inclined surface HS4 of the through-hole TH may be changed. The distance may increase toward the lower region from the upper region of the through-hole TH. That is, when the distance between the third inclined surface HS3 and the fourth inclined surface HS4 is changed toward the lower region from the upper region of the through-hole TH, the distance may increase toward the lower region from the upper region of the through-hole TH.

The area of the second extension portion 325 may be less than about ½ of the entire area of the inner surface of the through-hole TH. Specifically, the area of the second extension portion 325 may be less than about ½ of the sum of the areas of the first to fourth inclined surfaces HS1, HS2, HS3, and HS4. When the area of the second extension portion 325 is about ½ or more, the second extension portion 325 may be in contact with and electrically connected the first extension portion 315. Accordingly, it is desirable that the area of the second extension portion 325 disposed in the through-hole TH satisfies the above-described range. In addition, the area of the second extension portion 325 may correspond to the area of the first extension portion 315. Accordingly, the sum of the areas of the first extension portion 315 and the second extension portion 325 may be smaller than the entire area of the inner surface of the through-hole TH.

The second extension portion 325 may have a shape corresponding to the through-hole TH. Specifically, when the through-hole TH has a quadrangular shape as shown in FIG. 12 when viewing it in a plane, the second extension portion 325 may have a shape corresponding to the through-hole TH. For example, the second extension portion 325 may have a '⊏' shape when viewing it in a plane. The first extension portion 315 and the second extension portion 325 may have shapes symmetrical with respect to the second direction (y-axis).

The second extension portion 325 may have an inclination angle with respect to the second metal portion 320. Specifically, the inclined surfaces HS1, HS2, HS3, and HS4 of the through-hole TH have an alternate angle with respect to the rear surface of the body 100, and accordingly, the second extension portion 325 may be disposed to be inclined to the second metal portion 320, and may have an alternate inclination angle.

The thickness of the second extension portion 325 may correspond to a thickness of the second metal portion 320. For example, the thicknesses of the second metal portion 320 and the second extension portion 325 may be about 5 µm or less. Specifically, the thicknesses of the second metal portion 320 and the second extension portion 325 may be about 2 µm to about 5 µm. When the thicknesses of the second metal portion 320 and the second extension portion 325 are thinner than the above-described range, they may not serve as a heat dissipation path, and when they are thicker than the above-described range, it may be difficult to secure a region in which the conductive portions 771 and 772 may be disposed in the through-hole TH. Therefore, it is desirable that the thicknesses of the second metal portion 320 and the second extension portion 325 satisfy the above-described ranges.

The thicknesses of the second metal portion 320 and the second extension portion 325 may correspond to the thicknesses of the first metal portion 310 and the first extension portion 315. Accordingly, the rear surface of the first metal portion 310 disposed on the rear surface of the first body 110 may be disposed on the same plane as the rear surface of the second metal portion 320.

In addition, the distance between the first extension portion 315 and the second extension portion 325 may be partially changed and partially constant. For example, a distance between the first extension portion 315 disposed on the first inclined surface HS1 and the second extension portion 325 disposed on the second inclined surface HS2 may be changed. Specifically, the distance between the first extension portion 315 and the second extension portion 325 disposed on the inclined surfaces HS1 and HS2, respectively, may increases toward the lower region from the upper region of the through-hole TH.

In addition, the distance between the first extension portion 315 and the second extension portion 325 disposed on the third inclined surface HS3 and the fourth inclined surface HS4, respectively, may be constant. Specifically, the first extension portion 315 and the second extension portion 325 disposed on the inclined surfaces HS3 and HS4 may have a first distance d1 defined as the shortest distance. In addition, the first distance d1 may be smaller than the shortest distance between the first bonding portion 501 and the second bonding portion 502.

The first metal portion 310 and the second metal portion 320 may be disposed on the same plane. For example, the first metal portion 310 and the second metal portion 320 disposed on the rear surface of the first body 110 may be disposed on the same plane. In this case, the first metal portion 310 and the second metal portion 320 may have a second distance d2 defined as a value of the shortest distance. At this time, the first distance d1 and the second distance d2 may correspond to each other.

The body 100 may further include a second recess R2. Referring to FIGS. 7 and 12, the second recess R2 may be formed on the rear surface of the first body 110. The second recess R2 may have a concave shape toward the upper surface from the rear surface of the first body 110. The second recess R2 may be disposed between the first metal portion 310 and the second metal portion 320. Specifically, the second recess R2 may be disposed between the first extension portion 315 and the second extension portion 325. Further, the second recess R2 may be disposed on the inclined surface of the through-hole TH. Specifically, the second recess R2 may be disposed on the third inclined surface HS3 and the fourth inclined surface HS4. Accordingly, the first metal portion 310 and the second metal portion 320 may be electrically separated.

Accordingly, the light-emitting device package 1000 according to the embodiment may effectively inject the conductive portions 771 and 772 to be described later into the through-hole TH. Specifically, the conductive portions 771 and 772 may be effectively injected as the area of the lower region of the through-hole TH is larger than the area of the upper region. In addition, as the through-hole TH has an inclined surface, the metal portion 300 may be uniformly formed on the inclined surface, and a contact area between the bonding portions 501 and 502 and the conductive portions 771 and 772 may be expanded to improve the electrical characteristics. In addition, as the through-hole TH has the inclined surface, electrical interference between the conductive portions 771 and 772 connected to each of the bonding portions 501 and 502 may be effectively blocked.

FIG. 15 is a cross-sectional view showing a modified example of the light-emitting device package of FIG. 9. Referring to FIG. 15, the first body 110 may include a through-hole TH. The through-hole TH may be a hole passing through the upper and lower surfaces of the first body 110. The depth of the through-hole TH may correspond to the height of the first body 110.

The width of the upper region of the through-hole TH may be smaller than the width of the lower region. The width of the through-hole TH may change or be constant from the rear surface of the body 100 toward the upper surface. Accordingly, the area of the upper region of the through-hole TH may be smaller than the area of the lower region.

The through-hole TH may include a first section of which width decreases toward the upper surface of the body 100 based on the rear surface of the body 100, and may include a second section having a constant width.

The second section may be disposed above the first section. A height in a vertical direction (third direction, z-axis) of the second section may be less than or equal to a height of the first section. For example, the height in the vertical direction of the first section may be about 90% or less of the total height of the through-hole TH. Specifically, the height of the first section may be about 80% or less of the total height of the through-hole TH. In addition, the height in the vertical direction of the second section may be about 10% or more of the total height of the through-hole TH. Specifically, the height of the second section may be about 20% or more of the total height of the through-hole TH.

The first section of the through-hole TH may be an inclined surface inclined with respect to the rear surface of the body 100. For example, the first section of the through-hole TH may include the first to fourth inclined surfaces HS1, HS2, HS3, and HS4, and the first to fourth inclined surfaces HS1, HS2, HS3, and HS4 may form an alternate angle with respect to the rear surface of the body 100. Accordingly, the distance between the first inclined surface HS1 and the second inclined surface HS2 may decrease toward the upper surface from the rear surface of the body 100. In addition, the distance between the third inclined surface HS3 and the fourth inclined surface HS4 may decrease toward the upper surface from the rear surface of the body 100.

In addition, the second section of the through-hole TH may be a surface perpendicular to the upper surface of the body 100. For example, the second section of the through-hole TH may include fifth to eighth inclined surfaces. In this case, the fifth inclined surface may be a surface connected to the first inclined surface HS1, and the sixth inclined surface may be a surface connected to the second inclined surface HS2. Further, the seventh inclined surface may be a surface connected to the third inclined surface HS3, and the eighth inclined surface may be a surface connected to the fourth inclined surface HS4. Accordingly, a distance between the fifth inclined surface and the sixth inclined surface may be constant toward the upper surface from the rear surface of the body 100. Further, a distance between the seventh inclined surface and eighth inclined surface may be constant toward the upper surface from the rear surface of the body 100.

The metal portion 300 may be disposed on the rear surface of the body 100. Specifically, the metal portion 300 may be disposed on the rear surface of the first body 110 and the inner surface of the through-hole TH, for example, the inclined surface of the through-hole TH. The metal portion 300 may be extended from the rear surface of the body 100 to the inner surface of the through-hole TH to be in direct contact with the first and second bonding portions 501 and 502.

The metal portion 300 may include the first metal portion 310 and the second metal portion 320 spaced apart from each other. The first metal portion 310 and the second metal portion 320 may be separated physically.

The first metal portion 310 may include the first extension portion 315. Specifically, the first metal portion 310 may include the first extension portion 315 disposed in the through-hole TH. In addition, the second metal portion 320 may include the second extension portion 325. Specifically, the second metal portion 320 may include the second extension portion 325 disposed in the through-hole TH.

The thickness of the first metal portion 310 may correspond to the thickness of the first extension portion 315, and the thickness of the second metal portion 320 may correspond to the thickness of the second extension portion 325. In addition, the thickness of the first metal portion 310 may correspond to the thickness of the second metal portion 320, and the thickness of the first extension portion 315 may correspond to the thickness of the second extension portion 325.

The first extension portion 315 may be disposed on the inclined surface of the through-hole TH. For example, the first extension portion 315 may be disposed on the entire region of the first inclined surface HS1 and the fifth inclined surface, and may be disposed on a partial region of the third inclined surface HS3, a partial region of the seventh inclined surface, a partial region of the fourth inclined surface HS4, and a partial region of the eighth inclined surface.

The second extension portion 325 may be disposed on the inclined surface of the through-hole TH. For example, the second extension portion 325 may be disposed on the entire region of the second inclined surface HS2 and the sixth inclined surface, and may be disposed on another partial region of the third inclined surface HS3, another partial region of the seventh inclined surface, another partial region of the fourth inclined surface HS4, and another partial region of the eighth inclined surface.

The distance between the first extension portion 315 and the second extension portion 325 may be partially changed and partially constant. Specifically, the distance between the first and second extension portions 315 and 325 disposed on a region corresponding to the first section of the through-hole TH may decrease toward the upper surface from the rear surface of the body 100. In addition, the distance between the first and second extension portions 315 and 325 disposed on a region corresponding to the second section of the through-hole TH may be constant toward the upper surface from the rear surface of the body 100.

Accordingly, the light-emitting device package 1000 according to the embodiment may effectively inject the conductive portions 771 and 772 to be described later into the through-hole TH. That is, the conductive portions 771 and 772 may be effectively injected as the area of the lower region of the through-hole TH is larger than the area of the upper region. In addition, as the through-hole TH includes the first section and the second section, electrical interference between the conductive portions 771 and 772 connected to each of the bonding portions 501 and 502 may be effectively blocked without a second resin 220 and/or a partition wall portion 790 to be described later.

With reference to FIG. 16, an example in which a second resin 220 is further disposed in the light-emitting device package 1000 of FIG. 9 will be described. Referring to FIG. 16, the light-emitting device package 1000 according to an embodiment may further include the second resin 220. The second resin 220 may be disposed on the rear surface of the light-emitting device 500. The second resin 220 may be disposed between the first bonding portion 501 and the second bonding portion 502. The second resin 220 may be disposed on a region corresponding to the through-hole TH.

The upper surface of the second resin 220 may be in contact with the rear surface of the light-emitting structure 520. In addition, one side of the second resin 220 may be in contact with a side surface of the first bonding portion 501, and the other side surface of the second resin 220 may be in contact with a side surface of the second bonding portion 502.

The rear surface of the second resin 220 may be disposed below the rear surfaces of the first bonding portion 501 and the second bonding portion 502 in the vertical direction. Accordingly, a partial region of the second resin 220 may be disposed to be in contact with a lower surface of the first bonding portion 501 and a lower surface of the second bonding portion 502.

The rear surface of the second resin 220 may be positioned below the upper surface of the first body 110 in the vertical direction. Accordingly, the second resin 220 may be disposed in the through-hole TH. When viewed upwardly from the lower portion of the light-emitting device 500, the through-hole TH may be provided around the second resin 220.

The second resin 220 may be disposed to be spaced apart from the first metal portion 310 and the second metal portion 320. That is, the second resin 220 may be disposed between the first bonding portion 501 and the second bonding portion 502, and may serve to prevent the bonding portions 501 and 502 from being connected to each other by the conductive portions 771 and 772 while providing the conductive portions 771 and 772 later. In addition, the second resin 220 may provide a path through which the conductive portions 771 and 772 may be connected to the first and second bonding portions 501 and 502 via the first and second metal portions 310 and 320.

FIGS. 17 and 18 are a cross-sectional view and a rear view showing a light-emitting device package including a plurality of light-emitting devices.

Referring to FIGS. 17 and 18, the light-emitting device package may include a plurality of light-emitting devices 500A and 500B disposed in the body 100. For example, a first light-emitting device 500A and a second light-emitting device 500B spaced apart in a first direction may be disposed in the body 100. The first light-emitting device 500A may be disposed adjacent to the first side surface S1 of the body 100, and the second light-emitting device 500B may be disposed adjacent to the second side surface S2 of the body 100. A barrier portion 135 may be disposed between the first light-emitting device 500A and the second light-emitting device 500B. For example, as shown in FIG. 17, the light-emitting devices 500A and 500B may be spatially separated by the barrier portion 135, for example, the second body 130.

The body 100 may include a plurality of through-holes. For example, the first body 110 may include a plurality of through-holes. For example, the first body 110 may include a first through-hole TH1 and a second through-hole TH2 spaced apart from each other. The first and second through-holes TH1 and TH2 may be holes passing through the upper and lower surfaces of the first body 110. Depths of the first and second through-holes TH1 and TH2 may correspond to the height of the first body 110.

The first through-hole TH1 may be disposed under the first light-emitting device 500A. The first through-hole TH1 may be disposed at a position vertically overlapped with the first light-emitting device 500A. The first bonding portion 501 and the second bonding portion 502 of the first light-emitting device 500A may be disposed at positions corresponding to the first through-hole TH1 in the vertical direction. A partial region of the first bonding portion 501 and the second bonding portion 502 of the first light-emitting device 500A may be exposed by the first through-hole TH1. In addition, the second through-hole TH2 may be disposed under the second light-emitting device 500B. The second through-hole TH2 may be disposed at a position vertically overlapped with the second light-emitting device 500B. The first bonding portion 501 and the second bonding portion 502 of the second light-emitting device 500B may be disposed at positions corresponding to the second through-hole TH2 in the vertical direction. The partial region of the first bonding portion 501 and the second bonding portion 502 of the second light-emitting device 500B may be exposed by the second through-hole TH2.

Metal portions 310, 320, 330, and 340 may be disposed on the rear surface of the body 100. For example, the metal portions may include a first metal portion 310, a second metal portion 320, a third metal portion 330, and a fourth metal portion 340.

The first metal portion 310 may be disposed on the rear surface of the first body 110. The first metal portion 310 may include the first extension portion 315 disposed in the first through-hole TH1. The first metal portion 310 may be connected to the first bonding portion 501 of the first light-emitting device 500A.

The second metal portion 320 may be disposed on the rear surface of the first body 110. The second metal portion 320 may be disposed to be spaced apart from the first metal portion 310. The second metal portion 320 may include the second extension portion 325 disposed in the first through-hole TH1. The second extension portion 325 may be disposed to be spaced apart from the first extension portion 315 in the first through-hole TH1. The second metal portion 320 may be connected to the second bonding portion 502 of the first light-emitting device 500A.

The third metal portion 330 may be disposed on the rear surface of the first body 110. The third metal portion 330 may be connected to the second metal portion 320. The third metal portion 330 may be integrally formed with the second metal portion 320. The third metal portion 330 may include a third extension portion 335 disposed in the second through-hole TH2. The third metal portion 330 may be connected to the second bonding portion 502 of the second light-emitting device 500B.

The fourth metal portion 340 may be disposed on the rear surface of the first body 110. The fourth metal portion 340 may be disposed to be spaced apart from the third metal portion 330. The fourth metal portion 340 may include a fourth extension portion 345 disposed in the second through-hole TH2. The fourth extension portion 345 may be disposed to be spaced apart from the third extension portion 335 in the second through-hole TH2. The fourth metal portion 340 may be connected to the second bonding portion 502 of the second light-emitting device 500B.

The first and second light-emitting devices 500A and 500B may be connected in series or in parallel. For example, the first bonding portion 501 of the first light-emitting device 500A may be connected to the first extension portion 315, and the second bonding portion 502 of the first light-emitting device 500A may be connected to the second extension portion 325. In addition, the first bonding portion 501 of the second light-emitting device 500B may be connected to the third extension portion 335, and the second bonding portion 502 of the second light-emitting device 500B may be connected to the fourth extension portion 345. In this case, the second extension portion 325 and the third extension portion 335 may be connected to each other by the second metal portion 320 and the third metal portion 330. The second metal portion 320 and the third metal portion 330 may connect the two light-emitting devices 500A and 500B in series, and may function as a heat dissipation plate. The first extension portion 315 and the fourth extension portion 345 may be both electrodes of the two light-emitting devices 500A and 500B connected in series.

In addition, in FIGS. 17 and 18, it is disclosed only that the through-hole TH is vertical and the metal portion disposed in the through-hole is vertical. However, the embodiment is not limited thereto, and the through-hole TH may have an inclined surface as shown in FIGS. 9 to 15. Accordingly, the metal portion may also be disposed to be inclined.

FIGS. 19 to 24 are views showing an example in which a light-emitting device package according to an embodiment is disposed on a circuit board. For example, FIGS. 19 to 24 are views showing an example of a light source module in which the light-emitting device package is disposed on the circuit board.

FIG. 19 is a view showing an example in which the light-emitting device package of FIG. 5 is disposed on the circuit board, FIG. 20 is a view showing an example in which the light-emitting device package of FIG. 8 is disposed on the circuit board, and FIG. 21 is a view showing an example in which a partition wall portion in FIG. 19 is additionally disposed. In addition, FIG. 22 is a view showing an example in which the light-emitting device package of FIG. 13 is disposed on the circuit board, FIG. 23 is a view showing an example in which the light-emitting device package of FIG. 16 is disposed on the circuit board, and FIG. 24 is a view showing an example in which a partition wall portion in FIG. 22 is additionally disposed.

Referring to FIGS. 19 to 24, the light source module may include one or a plurality of light-emitting device packages 1000 disposed on a circuit board 710. A power supply circuit for controlling driving of the light-emitting device package 1000 may be provided on the circuit board 710.

The light-emitting device package 1000 may be disposed on the circuit board 710. For example, the light-emitting device package 1000 may be disposed such that the rear surface of the light-emitting device package 1000 faces an upper surface of the circuit board 710. Specifically, the metal portion 300 may be disposed so as to face the upper surface of the circuit board 710. More specifically, the first and second extension portions 315 and 325 may be disposed so as to face the upper surface of the circuit board 710.

The circuit board 710 may be a printed circuit board (PCB). The circuit board 710 may include at least one of a resin material PCB, a metal core PCB (MCPCB), a flexible PCB (FPCB), and a rigid PCB. In the circuit board 710, an insulating layer or a protective layer 730 is disposed on a base layer made of a resin or metal material, and pads 751 and 752 exposed from the insulating layer or the protective layer 730 are disposed. The pads 751 and 752 may electrically connect one or the plurality of light-emitting device packages 1000. The insulating layer or the protective layer 730 may be made of a solder resist material or a resin material.

The pads 751 and 752 may include at least one material selected from the group consisting of Ti, Cu, Ni, Au, Cr, Ta, Pt, Sn, Ag, P, Fe, Sn, Zn, and Al, or an alloy thereof.

The pads 751 and 752 may include a first pad 751 and a second pad 752. The pads 751 and 752 may include the first pad 751 and the second pad 752 spaced apart from each other. The first pad 751 may be disposed at a position corresponding to the first bonding portion 501 in a vertical direction (a third direction). The second pad 752 may be disposed at a position corresponding to the second bonding portion 502 in the vertical direction (the third direction).

The first pad 751 may be electrically connected to the first bonding portion 501, and the second pad 752 may be electrically connected to the second bonding portion 502. For example, the first metal portion 310 may be disposed between the first pad 751 and the first bonding portion 501, and the second metal portion 320 may be disposed between the second pad 752 and the second bonding portion 502. Specifically, the first extension portion 315 may be disposed between the first pad 751 and the first bonding portion 501, and the second extension portion 325 may be disposed between the second pad 752 and the second bonding portion 502. In addition, a first conductive portion 771 may be disposed between the first pad 751 and the first bonding portion 501, and a second conductive portion 772 may be disposed between the second pad 752 and the second bonding portion 502. The first conductive portion 771 and the second conductive portion 772 may be disposed to be spaced apart from each other. Specifically, the first conductive portion 771 and the second conductive portion 772 may be separated physically, thereby preventing an electric short between the first and second conductive portions 771 and 772.

The conductive portions 771 and 772 may include one material selected from the group consisting of Ag, Au, Pt, Sn, and Cu, or an alloy thereof. The conductive portions 771 and 772 may include a solder paste, an Ag paste, and a SAC (Sn—Ag—Cu) paste. The conductive portions 771 and 772 may be combined with a material constituting the bonding portions 501 and 502 or the pads 751 and 752 to be bonded by an intermetallic compound layer. The intermetallic compound may include at least one of $Cu_xSn_y$, $Ag_xSn_y$, and $Au_xSn_y$, and x may satisfy a condition of $0<x<1$, $y=1-x$, $x>y$.

The first and second conductive portions 771 and 772 made of a liquid material are positioned on the first pad 751 and the second pad 752 of the circuit board 710, and then they are coupled to the light-emitting devices 500 arranged on the circuit board 710. At this time, the first conductive portion 771 disposed on the first pad 751 and the second conductive portion 772 disposed on the second pad 752 may be injected into the through-hole TH to couple to the first and second bonding portions 501 and 502, respectively. Specifically, the first conductive portion 771 may be diffused via the first metal portion 310 to couple to the first bonding portion 501. In addition, the second conductive portion 772 may be diffused via the second metal portion 320 to couple to the second bonding portion 502. More specifically, the first conductive portion 771 may be diffused via the first extension portion 315 in the through-hole TH to couple to the first bonding portion 501. In addition, the second conductive portion 772 may be diffused via the second extension portion 325 in the through-hole TH to couple to the second bonding portion 502. Accordingly, the first conductive portion 771 may be in direct contact with the first metal portion 310. For example, the first conductive portion 771 may be in direct contact with the first extension portion 315 and/or the first metal portion 310, and may be spaced apart from the second metal portion 320. In addition, the second conductive portion 772 may be in direct contact with the second metal portion 320. For example, the second conductive portion 772 may be in direct contact with the second extension portion 325 and/or the second metal portion 320, and may be spaced apart from the first metal portion 310.

The rear surface of the first body 110 may be disposed between the first metal portion 310 and the second metal portion 320. Specifically, the rear surface of the first body 110 at which the second recess R2 is formed may be disposed between the first metal portion 310 and the second metal portion 320 (see FIGS. 4 and 12). That is, it is possible to prevent a liquid conductive paste from being diffused by the first body 110, and accordingly, it is possible to block electrical interference between the first conductive portion 771 and the second conductive portion 772.

In addition, referring to FIGS. 20 and 23, the light-emitting device package 1000 may further include a second resin 220. For example, the light-emitting device package 1000 may further include a second resin 220 provided on the rear surface of the light-emitting device 500. The second resin 220 may be disposed between the first bonding portion 501 and the second bonding portion 502. Accordingly, in the embodiment, the flow or diffusion of the first and second conductive portions 771 and 772 may be prevented by using the second resin 220 including a resin material, and it is possible to induce that each of the first and second conductive portions 771 and 772 is connected to the first and second bonding portions 501 and 502, respectively.

In addition, referring to FIGS. 21 and 24, a partition wall portion 790 may be provided on the circuit board 710. The partition wall portion 790 may include an insulating material. For example, the partition wall portion 790 may include at least one of an epoxy-based material, a silicone-based material, and a hybrid material containing the epoxy-based material and the silicone-based material. The partition wall portion 790 may include a material corresponding to the body 100. In addition, the partition wall portion 790 may include a material corresponding to the first resin 210. Further, the partition wall portion 790 may include a material corresponding to the second resin 220.

The partition wall portion 790 may be disposed between the first pad 751 and the second pad 752 of the circuit board 710. The partition wall portion 790 may be disposed on a region corresponding to the through-hole TH in the vertical direction. The partition wall portion 790 may be disposed between the first metal portion 310 and the second metal portion 320. Specifically, the partition wall portion 790 may be disposed between the first extension portion 315 and the second extension portion 325. In addition, the partition wall portion 790 may be disposed between the first bonding portion 501 and the second bonding portion 502.

The partition wall portion 790 may be disposed in the through-hole TH. A height (a length in the third direction) of the partition wall portion 790 may be greater than the thickness of the first body 110. Accordingly, it is possible to prevent the first and second bonding portions 501 and 502 from being electrically connected by the conductive portions 771 and 772.

An upper surface of the partition wall portion 790 may be disposed in contact with the rear surface of the light-emitting device 500. In addition, a rear surface of the partition wall portion 790 may be disposed in contact with the upper surface of the circuit board 710. The partition wall portion 790 may be provided integrally with the circuit board 710, or may be separately separated and disposed to couple to the circuit board 710.

FIG. 25 is a side sectional view showing an example of a light-emitting device applied to a light-emitting device package according to an embodiment.

Referring to FIG. 25, in the light-emitting device 500 only the relative arrangement relationship between a first electrode 550 and a second electrode 570 is conceptually shown. The first electrode 550 may include a first bonding portion 551 and a first branched electrode 553. The second electrode 570 may include a second bonding portion 571 and a second branched electrode 573. Prior to description of the light-emitting device by FIG. 23, the first bonding portion 551 may correspond to the first bonding portion 501 described above, and the second bonding portion 571 may correspond to the second bonding portion 501 described above.

The light-emitting device 500 may include the light-emitting structure 520 disposed on the substrate 510. The substrate 510 may be formed of an insulating material or a semiconductor material as a light-transmitting layer. The substrate 510 may be selected from the group consisting of a sapphire substrate ($Al_2O_3$), SiC, GaAs, GaN, ZnO, Si, GaP, InP, and Ge. For example, the substrate 510 may be provided as a patterned sapphire substrate (PSS) in which a concavo-convex pattern is formed on the upper surface.

The light-emitting structure 520 may be provided as a compound semiconductor. The light-emitting structure 520 may be provided as, for example, a Group II-VI or Group III-V compound semiconductor. As an example, the light-emitting structure 520 may be provided with at least two or more elements selected from aluminum (Al), gallium (Ga), indium (In), phosphorus (P), arsenic (As), and nitrogen (N).

The light-emitting structure 520 may include a first conductive type semiconductor layer 521, an active layer 522, and a second conductive type semiconductor layer 523. The active layer 522 may be disposed between the first conductive type semiconductor layer 521 and the second conductive type semiconductor layer 523. For example, the active layer 522 may be disposed on the first conductive type semiconductor layer 521, and the second conductive type semiconductor layer 523 may be disposed on the active layer 522.

The first conductive type semiconductor layer 521 and the second conductive type semiconductor layer 523 may be implemented as at least one of the Group II-VI or Group III-V compound semiconductors. The first and second conductive type semiconductor layers may be formed of a semiconductor material having an empirical formula of $In_xAl_yGa_{1-x-y}N$ ($0 \leq x \leq 1$, $0 \leq y \leq 1$, $0 \leq x+y \leq 1$). For example, the first conductive type semiconductor layer 521 and the second conductive type semiconductor layer 523 may include at least one selected from the group consisting of GaN, AlN, AlGaN, InGaN, InN, InAlGaN, AlInN, AlGaAs, GaP, GaAs, GaAsP, AlGaInP, and the like. The first conductive type semiconductor layer 521 may be an n-type semiconductor layer doped with an n-type dopant such as Si, Ge, Sn, Se, or Te. The second conductive type semiconductor layer 523 may be a p-type semiconductor layer doped with a p-type dopant such as Mg, Zn, Ca, Sr, or Ba. Alternatively, the first conductive type semiconductor layer 521 may be provided as a p-type semiconductor layer, and the second conductive type semiconductor layer 523 may be provided as an n-type semiconductor layer.

The active layer 522 may be implemented as a compound semiconductor. The active layer 522 may be implemented as at least one of the Group III-V or Group II-VI compound semiconductors. When the active layer 522 is implemented as a multi-well structure, the active layer 522 may include a plurality of well layers and a plurality of barrier layers that are alternately disposed, and the active layer 522 may be disposed as the semiconductor material having an empirical formula of $In_xAl_yGa_{1-x-y}N$ (0≤x≤1, 0≤y≤1, 0≤x+y≤1). For example, the active layer may include at least one selected from the group consisting of InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

The first electrode 550 may be electrically connected to the second conductive type semiconductor layer 523. The first branched electrode 553 may be branched from the first bonding portion 551. The first branched electrode 553 may include a plurality of branch electrodes branched from the first bonding portion 551. The second electrode 570 may include the second bonding portion 571 and the second branched electrode 573. The second electrode 570 may be electrically connected to the first conductive type semiconductor layer 521. The second branched electrode 573 may be branched from the second bonding portion 571. The second branched electrode 573 may include a plurality of branch electrodes branched from the second bonding portion 571.

The first branched electrode 553 and the second branched electrode 573 may be disposed to stagger each other in a finger shape. A power supplied through the first bonding portion 551 and the second bonding portion 571 by the first branched electrode 553 and the second branched electrode 573 may be diffused and provided at the entire light-emitting structure 520.

The first electrode 550 and the second electrode 570 may be formed as a single-layer structure or a multi-layer structure. For example, the first electrode 550 and the second electrode 570 may be an ohmic electrode. For example, the first electrode 550 and the second electrode 570 may be formed of at least one material of ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, and Hf, or an alloy of two or more thereof.

Meanwhile, a protective layer may be further provided at the light-emitting structure 520. The protective layer may be provided at the upper surface of the light-emitting structure 520. In addition, the protective layer may be provided at the side surface of the light-emitting structure 520. The protective layer may be provided so that the first bonding portion 551 and the second bonding portion 571 are exposed. In addition, the protective layer may be selectively provided at the periphery and the lower surface of the substrate 510. As an example, the protective layer may be provided as an insulating material. For example, the protective layer may be formed of at least one material selected from the group consisting of $SiO_y$, $SiO_xN_y$, $Si_xN_y$, and $Al_xO_y$.

In the light-emitting device according to the embodiment, light generated in the active layer 522 may be emitted in six surface directions of the light-emitting device. The light generated in the active layer 522 may be emitted in six surface directions through an upper surface, a low surface, and four side surfaces of the light-emitting device.

The light-emitting device 500 has been described with a structure having one light-emitting cell. When the light-emitting cell includes the light-emitting structure, a driving voltage of the light-emitting device may be a voltage applied to one light-emitting cell. As an example, the light-emitting device 500 according to the embodiment may include a light-emitting device having two or three or more light-emitting cells. Accordingly, it is possible to provide a high voltage light-emitting device package.

The light-emitting device package 1000 according to the embodiment may include the body 100 including the through-hole TH, and internal heat may be effectively discharged by the metal portion 300 disposed on the rear surface of the body 100 and the inner surface of the through-hole TH. In addition, the first resin 210 may be disposed between the light-emitting device 500 and the body 100 to improve adhesive force and holding force of the light-emitting device 500, and may prevent the light-emitting device 500 from being tilted to improve alignment characteristics.

In addition, in the embodiment, the metal portion 300 disposed in the through-hole TH may effectively inject the conductive portions 771 and 772, and may adjust a position, a distribution, a shape, etc. of the conductive portions 771 and 772. Accordingly, a heat dissipation path may be set, and coupling force between the light-emitting device package and the circuit board may be improved.

Further, in the embodiment, it is possible to block electrical interference between the conductive portions 771 and 772 connected to each of the bonding portions 501 and 502, and it is possible to prevent a problem of electrical opening due to non-uniformity of the conductive portions 771 and 772, and thus the electrical characteristics may be improved.

In addition, the second resin 220 or the partition wall portion 790 may be disposed in the through-hole TH to suppress or minimize formation of voids, and accordingly, the reliability of the light-emitting device package 1000 may be improved.

In addition, in the embodiment, it is possible to prevent the body from being damaged such as discoloration or deformation in a high temperature environment in the process of manufacturing the light-emitting device package, and it is possible to prevent a phenomenon that a bonding region between the light-emitting device and the package body is re-melted while the light-emitting device package is bonded to a substrate or the like.

The characteristics, structures and effects described in the embodiments above are included in at least one embodiment, but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the embodiment.

In addition, the above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the present invention defined in the appended claims.

The invention claimed is:

1. A light-emitting device package comprising:
a body including a through-hole passing through an upper surface and a lower surface thereof;
a light-emitting device disposed on the upper surface of the body and including first and second bonding portions spaced apart from each other; and
first and second metal portions disposed to be spaced apart from each other on a rear surface of the body,
wherein a partial region of each of the first and second bonding portions is overlapped with the through-hole in a vertical direction,
each of the first and second metal portions includes first and second extension portions extending to the through-hole,
each of the first and second extension portions is electrically connected to the first and second bonding portions, respectively, and
the first and second extension portions face each other in the through-hole.

2. The light-emitting device package of claim 1, wherein an area of an upper region of the through-hole is 60% to 95% of an area of the light-emitting device.

3. The light-emitting device package of claim 1, wherein the partial region of each of the first and second bonding portions is exposed by the through-hole.

4. The light-emitting device package of claim 1, wherein the first metal portion contains a material corresponding to the first extension portion,
the second metal portion contains a material corresponding to the second extension portion, and
the first and second metal portions contain at least one of copper (Cu), titanium (Ti), nickel (Ni), gold (Au), chromium (Cr), tantalum (Ta), platinum (Pt), tin (Sn), and silver (Ag).

5. The light-emitting device package of claim 1, wherein, a first resin in contact with outer surfaces of the first and second bonding portions is disposed on the upper surface of the body, and
the outer surfaces of the first and second bonding portions are spaced apart from the through-hole.

6. The light-emitting device package of claim 1, wherein a width of the through-hole increases toward a lower region from an upper region of the through-hole.

7. The light-emitting device package of claim 1, wherein a thickness of each of the first and second metal portions is 5 μm or less.

8. The light-emitting device package of claim 1, wherein a maximum distance between the first and second extension portions in the through-hole is larger than a shortest distance between the first and second bonding portions.

9. The light-emitting device package of claim 1, wherein a side wall is disposed around the upper surface of the body, and provides a cavity, and
the light-emitting device and the through-hole are disposed in the cavity.

10. The light-emitting device package of claim 1, wherein a thickness of each of the first and second metal portions is ⅓ or less of a horizontal width of the through-hole.

11. The light-emitting device package of claim 1, wherein the first and second extension portions are in direct contact with an inner surface of the through-hole.

12. The light-emitting device package of claim 11, wherein the upper surface of the body includes a first recess spaced apart from the through-hole,
the first recess has a concave shape toward the rear surface of the body from the upper surface of the body, and
a part of the first recess is disposed at a position vertically overlapped with the light-emitting device.

13. The light-emitting device package of claim 11, wherein a second recess is formed on the rear surface of the body,
the second recess is disposed between the first and second metal portions, and
the second recess has a concave shape toward the upper surface of the body from the rear surface of the body.

14. The light-emitting device package of claim 1, wherein the through-hole includes first and second inner surfaces facing each other, and third and fourth inner surfaces connecting the first and second inner surfaces,
the first extension portion is disposed on the first inner surface, a partial region of the third inner surface, and a partial region of the fourth inner surface, and
the second extension portion is disposed on the second inner surface, another partial region of the third inner surface, and another partial region of the fourth inner surface.

15. The light-emitting device package of claim 14, wherein an inclination angle of each of the first to fourth inner surfaces of the rear surface of the body is 90 degrees.

16. The light-emitting device package of claim 14, wherein inclination angles of the first and second inner surfaces of the rear surface of the body are alternate inclination angles, and inclination angles of the third and fourth inner surfaces of the rear surface of the body are 90 degrees.

17. The light-emitting device package of claim 14, wherein an inclination angle of each of the first to fourth inner surfaces of the rear surface of the body is an alternate inclination angle.

18. The light-emitting device package of claim 17, wherein an area of the upper region of the through-hole is smaller than that of the lower region of the through-hole.

19. A light source module comprising:
a circuit board including first and second pads; and
a light-emitting device package disposed on the circuit board and electrically connected to the first and second pads,
wherein the light-emitting device package includes:
a body including a through-hole passing through an upper surface and a lower surface thereof;
a light-emitting device disposed on the upper surface of the body and including first and second bonding portions spaced apart from each other; and
first and second metal portions disposed to be spaced apart from each other on a rear surface of the body,
wherein a partial region of each of the first and second bonding portions is overlapped with the through-hole in a vertical direction,
each of the first and second metal portions includes first and second extension portions extending to the through-hole,
each of the first and second extension portions is electrically connected to the first and second bonding portions, respectively, and
the first and second extension portions face each other in the through-hole.

20. The light source module of claim 19, further comprising:
a first conductive portion disposed between the first metal portion and the first pad; and
a second conductive portion disposed between the second metal portion and the second pad, wherein the first and second conductive portions are spaced apart from each other.

* * * * *